US008111378B2

(12) United States Patent
Uchikawa

(10) Patent No.: US 8,111,378 B2
(45) Date of Patent: Feb. 7, 2012

(54) EXPOSURE METHOD AND APPARATUS, AND DEVICE PRODUCTION METHOD

(75) Inventor: Kiyoshi Uchikawa, Tsukuba (JP)

(73) Assignee: Nikon Corporation, Tokyo (JP)

( * ) Notice: Subject to any disclaimer, the term of this patent is extended or adjusted under 35 U.S.C. 154(b) by 825 days.

(21) Appl. No.: 10/588,730

(22) PCT Filed: Feb. 10, 2005

(86) PCT No.: PCT/JP2005/002011
§ 371 (c)(1),
(2), (4) Date: Oct. 18, 2007

(87) PCT Pub. No.: WO2005/078774
PCT Pub. Date: Aug. 25, 2005

(65) Prior Publication Data
US 2008/0246933 A1    Oct. 9, 2008

(30) Foreign Application Priority Data

Feb. 13, 2004  (JP) ................................. 2004-037183

(51) Int. Cl.
*G03B 27/54* (2006.01)
*G03B 27/68* (2006.01)
*G03B 27/52* (2006.01)
(52) U.S. Cl. ................ 355/67; 355/52; 355/30
(58) Field of Classification Search .............. 355/52, 355/53, 71, 77, 67, 30, 35, 55
See application file for complete search history.

(56) References Cited

U.S. PATENT DOCUMENTS

| | | | |
|---|---|---|---|
| 5,390,228 A * | 2/1995 | Niibe et al. ................... 378/34 |
| 5,805,273 A | 9/1998 | Unno | |
| 5,995,263 A | 11/1999 | Tokuda et al. | |
| 6,198,579 B1 | 3/2001 | Rupp | |
| 6,307,688 B1 | 10/2001 | Merz et al. | |
| 6,388,823 B1 | 5/2002 | Gaber et al. | |
| 6,466,382 B2 | 10/2002 | Muller-Rissmann et al. | |
| 6,504,597 B2 | 1/2003 | Schuster et al. | |
| 6,521,877 B1 | 2/2003 | Muller-Rissmann et al. | |
| 6,522,392 B1 | 2/2003 | Muller-Rissmann et al. | |
| 6,583,850 B2 | 6/2003 | Hummel et al. | |
| 6,603,530 B1 | 8/2003 | Kohno | |

(Continued)

FOREIGN PATENT DOCUMENTS

EP    0 823 662 A2    2/1998

(Continued)

OTHER PUBLICATIONS

Hecht, Eugene. "Optics (Second Edition)," 1990, Addison-Wesley Publishing Company, p. 108-113.

(Continued)

*Primary Examiner* — Edward Glick
*Assistant Examiner* — Deoram Persaud
(74) *Attorney, Agent, or Firm* — Oliff & Berridge, PLC

(57) ABSTRACT

Disclosed is an exposure method which illuminates a first object with an exposure beam and exposes a second object with the exposure beam through the first object and a projection optical system, wherein at least a part of one of the first object and the projection optical system is irradiated with a light beam having a wavelength range different from that of the exposure beam through a space waveguide mechanism, to correct an imaging characteristic of the projection optical system.

28 Claims, 8 Drawing Sheets

U.S. PATENT DOCUMENTS

| | | |
|---|---|---|
| 6,781,668 B2 | 8/2004 | Schuster et al. |
| 7,817,249 B2 * | 10/2010 | Uehara ............................ 355/70 |
| 2001/0019403 A1 | 9/2001 | Schuster et al. |
| 2002/0008858 A1 | 1/2002 | Wagner et al. |
| 2003/0095241 A1 * | 5/2003 | Burghoorn ...................... 355/53 |
| 2004/0144915 A1 | 7/2004 | Wagner et al. |
| 2005/0018269 A1 | 1/2005 | Weiss et al. |
| 2008/0144164 A1 * | 6/2008 | Metivier .................. 359/341.32 |

FOREIGN PATENT DOCUMENTS

| | | |
|---|---|---|
| EP | 1 376 185 A2 | 1/2004 |
| EP | 1 670 041 A1 | 6/2006 |
| JP | A 8-45827 | 2/1996 |
| JP | A-9-115811 | 5/1997 |
| JP | A-10-050585 | 2/1998 |
| JP | A-10-064790 | 3/1998 |
| JP | A-10-256150 | 9/1998 |
| JP | A-2001-196305 | 7/2001 |
| WO | WO 03/017004 A2 | 2/2003 |
| WO | WO 2005/022614 A1 | 3/2005 |

OTHER PUBLICATIONS

Jun. 18, 2009 Office Action issued in European Patent Application No. 05 710 063.8.

Jun. 25, 2010 Office Action issued in Japanese Patent Application No. 2005-517966 (with translation).

May 4, 2011 Office Action issued in Korean Patent Application No. 2006-7012807 (with translation).

* cited by examiner

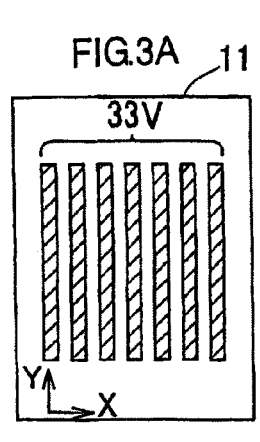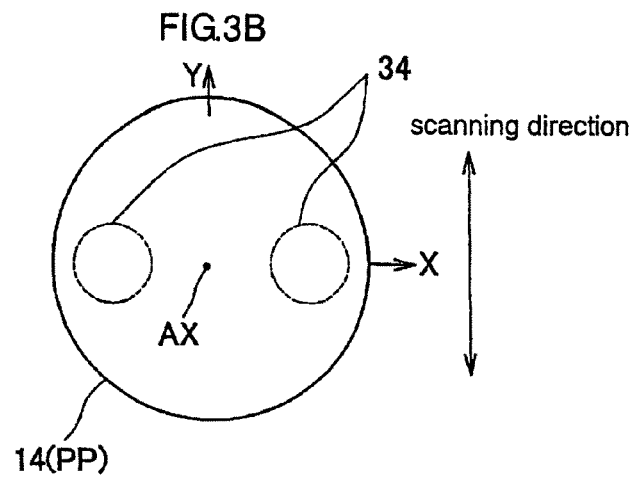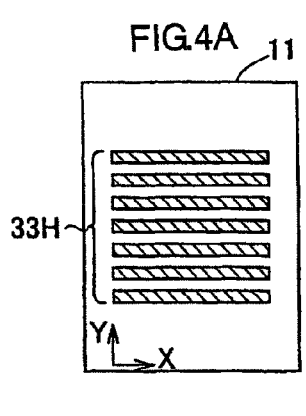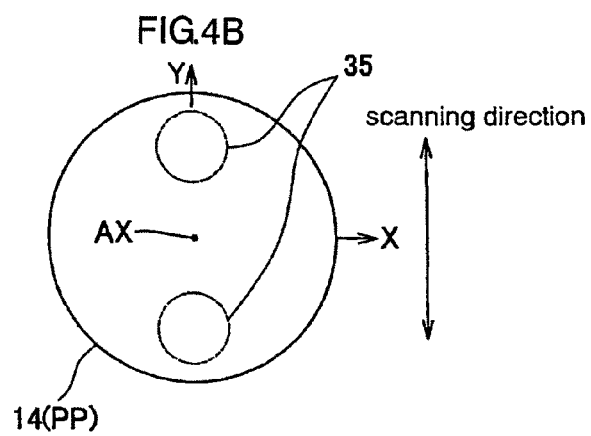

EXPOSURE METHOD AND APPARATUS, AND DEVICE PRODUCTION METHOD

The present invention relates to an exposure technology used for transferring a mask pattern onto a substrate, for example, in a lithography process for producing various devices, such as semiconductor elements or liquid crystal display elements, and a device production technology using the exposure technology, and more specifically relates to an exposure technology using a correction technology of imaging characteristic.

In producing semiconductor elements and the like, a projection exposure apparatus, such as a stepper, is used in order to transfer a pattern of a reticle as a mask (or a photomask or the like) to each shot area on a wafer (or a glass plate or the like) as a substrate, on which photoresist is coated, through a projection optical system. In the projection exposure apparatus, imaging characteristic of a projection optical system gradually varies due to an irradiation amount of exposure light, variations in an ambient atmospheric pressure, or the like. Then, in order to keep the imaging characteristic within a desired condition all the time, the projection exposure apparatus is provided with an imaging characteristic correction mechanism which corrects the imaging characteristic, for example, by controlling the position of some of optical members constituting the projection optical system. The imaging characteristic which can be corrected by the conventional correction mechanism is a lower order component of rotational symmetry, such as distortion aberration and magnification error.

On the other hand, in recent years, in order to increase the resolution with respect to a specific pattern, an illumination condition under which an exposure light does not pass through an area including an optical axis on the pupil plane of an illumination optical system, the illumination condition consisting of the so-called an annular illumination or a quadrupolar illumination (i.e., an illumination method wherein four areas on the pupil plane of an illumination optical system are used as a secondary light source), is sometimes used. In this case, an optical member in the vicinity of the pupil plane in the projection optical system is illuminated with an exposure light under an almost hollow condition. Moreover, in recent years, in order to increase the area of a pattern which can be transferred, without enlarging the projection optical system, a scanning exposure type projection exposure apparatus such as a scanning stepper is also used frequently. In case of the scanning exposure type, a reticle is illuminated in an illumination area of a rectangular shape whose short side direction is a scanning direction, and therefore, with regards to an optical member in the vicinity of the reticle and wafer in the projection optical system, rotationally asymmetric areas are mainly illuminated with the exposure light.

If the optical member is illuminated continuously with a hollow exposure light like in the former case, a variation with a high-order component such as a high order spherical aberration may arise in the imaging characteristics of the projection optical system. Therefore, conventionally, there is proposed a projection exposure apparatus, wherein in carrying out an annular illumination or a quadrupolar illumination, an aberration correcting illumination light in a wavelength range which is not sensitive to a photoresist is introduced to an area including an optical axis in the vicinity of the pupil plane of the illumination optical system or its conjugate plane and thereby the area including the optical axis of the optical member in the projection optical system is illuminated with an almost uniform light quantity distribution (for example, see Patent document 1). Furthermore, in the case where the reticle is illuminated in a rectangular shaped illumination area like in the latter case, there is proposed a projection exposure apparatus, wherein two areas, which sandwich the illumination area on the reticle in the short side direction, are illuminated with an aberration correcting illumination light in a wavelength range, which is not sensitive to the photoresist, thereby suppressing the variation in the rotationally asymmetric aberration (for example, see Patent document 2).

Patent document 1: Japanese Patent Application Laid-Open No. 10-64790
Patent document 2: Japanese Patent Application Laid-Open No. 10-50585

As described above, conventionally, in the case where a predetermined optical member is illuminated with a hollow exposure light like in the case of using an annular illumination or the like, or in the case where an optical member such as a reticle is illuminated in a rectangular shaped illumination area like in the case of scanning exposure, a correction of a high order spherical aberration and a rotationally asymmetric aberration component, for example, has been carried out by illuminating the reticle also with an aberration correcting illumination light in addition to the exposure light.

In this respect, in recent years, when transferring a reticle pattern which mainly includes, for example, a predetermined line-and-space pattern, a dipole illumination, wherein only two areas sandwiching the optical axis on the pupil plane of the illumination optical system are secondary light sources, is sometimes used. Because the light quantity distribution of this dipole illumination is significantly rotationally asymmetric as compared with that of a quadrupolar illumination, astigmatic aberration on the optical axis (hereinafter, referred to as "center astigmatism") which is a rotationally asymmetric aberration component, arises in the projected image. Moreover, the dipole illumination also causes a rotationally asymmetric aberration variation other than the center astigmatism.

Moreover, when only a pattern at one end in a non-scanning direction perpendicular to a scanning direction on the reticle is further exposed using the scanning exposure system, only the area at the one end in a rectangular shaped illumination area on the reticle is further illuminated with the exposure light. In this case, because the light quantity distribution of the exposure light becomes rotationally asymmetric more significantly in the optical members on the reticle side and on the wafer side of the projection optical system, a lot of rotationally asymmetric aberration components will arise. Similarly, also in the case where a pattern density of a reticle is particularly low in a specific area, the light quantity distribution of the exposure light becomes significantly rotationally asymmetric in the optical members on the reticle side and on the wafer side of the projection optical system, and therefore, rotationally asymmetric aberration components will arise.

In the case where a lot of rotationally asymmetric aberration components arise in this way, even when the aberration correcting illumination light which is not sensitive to the photoresist is irradiated to the reticle along an optical path, which is almost in parallel with the optical path of the exposure light, like in the conventional examples, it is difficult to irradiate a desired portion of the optical member precisely with this irradiation light, the desired portion of the optical member contributing to the occurrence of the rotationally asymmetric aberration component significantly, because the wavelength of this illumination light differs from that of the exposure light. For this reason, the rotationally asymmetric aberration component might not be corrected sufficiently.

Moreover, in order to irradiate a desired optical member in the projection optical system with the aberration correcting illumination light from the illumination optical system side, this illumination light needs to be in a wavelength range where the absorption by the optical element is not so high. Accordingly, since photosensitivity with respect to photoresist tends to increase, it is difficult to increase the light intensity of this illumination light, and therefore also from this point, the rotationally asymmetric aberration component might not be corrected sufficiently.

Furthermore, recently, an illumination condition under which the light quantity distribution of the exposure light varies significantly in a radial direction like in a small σ illumination (i.e., an illuminating method wherein a small area about the optical axis on the pupil plane of the illumination optical system is a secondary light source) is sometimes used. Also in this case, variations in the imaging characteristic, for example, a high order variation of the spherical-aberration or the like which is difficult to be corrected by the conventional imaging characteristic correction mechanism, may arise, and therefore, some kind of countermeasure has been desired.

In view of these points, it is a first object of the present invention to provide an exposure technology which can efficiently control a rotationally asymmetric component or a high order component among the imaging characteristics when the light quantity distribution of an exposure beam passing through at least a part of one of a projection optical system and a mask is rotationally asymmetric or it varies in a radial direction significantly.

Furthermore, it is a second objective of the present invention to provide an exposure technology and a device production technology capable of suppressing variations in the imaging characteristic in such a case.

In a first exposure method according to the present invention, a first object (11) is illuminated with an exposure beam (IL), and with this exposure beam a second object (18) is exposed through the first object and a projection optical system (14), wherein at least a part (32) of one of the first object and the projection optical system is irradiated with a light beam (LBA, LBB) having a wavelength range different from that of the exposure beam through a space waveguide mechanism (44A, 44B), to correct an imaging characteristic of the projection optical system.

According to the present invention, the optical beam illuminates the first object under an illumination condition in which the light beam is rotationally asymmetric, like a dipole illumination, for example, or under an illumination condition in which the light quantity distribution significantly varies in a radial direction on a pupil plane of the illumination optical system, like a small σ illumination, for example, resulting in causing a rotationally asymmetric aberration or a high order rotationally symmetric aberration. At this time, in the first object or a plurality of optical members in the projection optical system, the light beam is locally applied to a predetermined member having a large influence on the aberration due to heat absorption to heat the predetermined member through the space waveguide mechanism, thereby allowing the aberration to be controlled efficiently. As one example, the wavelength range of the light beam is set to a wavelength range easily absorbed by the member to be heated, and this light beam is directed to the member from above the side face of the member or from under the side face thereof in a direction obliquely intersecting the optical axis of the exposure beam, whereby only this member can be heated efficiently without exposing the second object.

In the present invention, one example of the space waveguide mechanism includes a hollow waveguide made of glass, ceramics, or metal. Because the waveguide can be bent at some degree of radius of curvature without degrading the transmission efficiency too much, use of the waveguide in the emitting portion of the light beam allows a desired irradiation position of the first object or an arbitrary optical member in the projection optical system to be locally irradiated with the light beam easily.

In a second exposure method according to the present invention, a first object (11) is illuminated with an exposure beam (IL), and with the exposure beam a second object (18) is exposed through the first object and a projection optical system (14), wherein at least a part (32) of one of the first object and the projection optical system is irradiated with a light beam (LBA, LBB) having a wavelength range different from that of the exposure beam and being in a predetermined polarization state through a polarization state control mechanism (51A, 51B), to correct an imaging characteristic of the projection optical system.

According to the present invention, a predetermined member, which has a large influence on the aberration due to heat absorption, is locally irradiated with the light beam through the polarization state control mechanism, the light beam being in a polarization state where the light beam is easily absorbed by the member, to heat the member, a rotationally asymmetric aberration or a high order rotational symmetric aberration can be controlled efficiently.

In the present invention, an example of the polarization state control mechanism includes a phase plate. Use of the phase plate allows a desired polarization state to be obtained with a simple configuration. As the phase plate, a ¼ wavelength plate or a ½ wavelength plate may be used.

In a third exposure method according to the present invention, the first object (11) is illuminated with the exposure beam (IL), and with this exposure beam the second object (18) is exposed through the first object and the projection optical system (14), wherein at least a part of one of the first object and the projection optical system is irradiated with a light beam (LBA, LBB) having a wavelength range different from the exposure beam and being in a predetermined polarization state through an optical guide (72A, 72B, 75B) and a polarization state control mechanism (74A, 74B), to correct an imaging characteristic of the projection optical system.

According to the present invention, a predetermined member, which has a large influence on the aberration due to heat absorption, is locally irradiated with a light beam through the optical guide to heat the member, a rotationally asymmetric aberration or a high order rotationally symmetric aberration can be controlled efficiently. Use of the optical guide in this case allows the light beam to be introduced to a desired heating location easily. Moreover, even if the polarization state of the light beam varied in the course of propagating in the optical guide, the light beam can be set to a desired polarization state by the polarization state control mechanism, and it is therefore possible to apply the light beam having a polarization state where the light beam is easily absorbed by the member.

In this case, an example of the optical guide is a hollow fiber, and an example of the polarization state control mechanism is a polarization plate.

In the present invention described above, the light beam is generated by an RF excited waveguide type $CO_2$ laser, for example. Because the light of a wavelength of 10.6 μm of the $CO_2$ laser, in particular, is easily absorbed by the optical member, the optical member can be heated locally and efficiently.

Moreover, when the at least the part of one of the first object and the projection optical system is illuminated with the exposure beam in a rotationally asymmetric light-quantity distribution, the light beam may be applied so as to correct a rotationally asymmetric aberration of the projection optical system generated by the irradiation of the exposure beam. This allows the rotationally asymmetric aberration to be suppressed.

Moreover, a generated amount of the rotationally asymmetric aberration may be calculated based on an irradiation amount of the exposure beam, and the light beam may be applied based on this calculation result. This allows the irradiation amount of the light beam to be controlled.

Moreover, a device production method according to the present invention includes a lithography process, and in this lithography process a pattern (11) is transferred onto a photosensitive element (18) using the exposure method of the present invention. Application of the present invention allows the imaging characteristic in using a dipole illumination and a small σ illumination to be improved, and therefore, devices can be produced with high precision.

Next, in a first exposure apparatus according to the present invention, a first object (11) on which a pattern for transfer is formed is illuminated with an exposure beam, and with the exposure beam a second object (18) is exposed through the first object and a projection optical system (14), wherein the exposure apparatus comprises an irradiation mechanism which irradiates at least a part (32) of one of the first object and the projection optical system with a light beam (LBA, LBB) having a wavelength range different from that of the exposure beam, and wherein the irradiation mechanism includes a space waveguide mechanism (44A, 44B) for guiding the light beam along a predetermined optical path.

According to the present invention, a predetermined member, which has a large influence on the aberration due to heat absorption, is locally irradiated with the light beam through the space waveguide mechanism to heat the member, a rotationally asymmetric aberration or a high order rotationally symmetric aberration can be controlled efficiently.

In this case, an example of the space waveguide mechanism includes a hollow waveguide made of glass, ceramics, or metal. An inner surface of the waveguide may be coated with a reflective film including at least one of a metal film and a dielectric film in order to reflect the light beam.

Moreover, in a second exposure apparatus according to the present invention, a first object (11) on which a pattern for transfer is formed is illuminated with an exposure beam, and with the exposure beam a second object (18) is exposed through the first object and a projection optical system (14), wherein the exposure apparatus comprises an irradiation mechanism which irradiates at least a part (32) of one of the first object and the projection optical system with a light beam (LBA, LBB) having a wavelength range different from that of the exposure beam, and wherein the irradiation mechanism includes a polarization state control mechanism (51A, 51B) which sets a polarization state of the light beam to a predetermined state.

According to the present invention, a predetermined member, which has a large influence on the aberration due to heat absorption, is irradiated with the light beam through the polarization state control mechanism, the light beam being in a polarization state where the light beam is easily absorbed by the member, to heat the member, a rotationally asymmetric aberration or a high order rotationally symmetric aberration can be controlled efficiently.

In this case, an example of the polarization state control mechanism includes a phase plate.

Next, in a third exposure apparatus according to the present invention, a first object (11) in which a pattern for transfer is formed is illuminated with an exposure beam, and with the exposure beam a second object (18) is exposed through the first object and a projection optical system (14), wherein the exposure apparatus comprises an irradiation mechanism which irradiates at least a part (32) of one of the first object and the projection optical system with a light beam (LBA, LBB) having a wavelength range different from that of the exposure beam, and wherein the irradiation mechanism includes an optical guide (72A, 72B, 75B) which guides the light beam from a light source (411A, 411B, 411) for generating the light beam, and a polarization state control mechanism (74A, 74B) which sets the polarization state of the light beams emitted from the optical guide to a predetermined state.

According to the present invention, a predetermined member, which has a large influence on the aberration due to heat absorption, is irradiated locally with the light beam via the optical guide and the polarization state control mechanism, the light beam being in a predetermined polarization state (for example, a polarization state in which the light beam is easily absorbed), to heat the member, a rotationally asymmetric aberration or a high order rotationally symmetric aberration can be controlled efficiently.

In this case, as one example, the optical guide is a hollow fiber and the polarization state control mechanism is a polarization plate.

In the present invention described above, the irradiation mechanism may include an RF excited waveguide type $CO_2$ laser as the light source for generating the light beam. In this case, there may be a plurality of RF excited waveguide type $CO_2$ lasers. For example, by disposing the $CO_2$ lasers correspondingly to the respective multiple locations to be irradiated of the members to be heated, each irradiation location can be heated within a short time.

Moreover, the irradiation mechanism may include a first beam splitter (65) for splitting the light beam. This allows the light beam from one light source to irradiate a plurality of irradiation areas simultaneously.

Moreover, the irradiation mechanism may include at least one of a movable mirror (57A, 57B) and a shutter in order to time-divide the light beam. This allows the light beam from one light source to irradiate a plurality of irradiation areas in a time-division manner.

Moreover, the exposure apparatus may comprise a light source control unit (412A, 412B) for controlling a light emitting duration of the light source (411A, 411B) which generate the light beam. The control of the light emitting duration allows the irradiation amount to be controlled.

Moreover, the exposure apparatus may include a second beam splitter (50A, 50B) for divaricating a portion of the light beam, and a photoelectric sensor (53A, 53B) for receiving the light divaricated by the second beam splitter, wherein with the photoelectric sensors, information on a light quantity of the light beam may be obtained. By measuring the light quantity of the light beam at a location as close as possible in this way to an emitting port of the light beam, the irradiation amount of the light beam can be controlled precisely.

Moreover, the exposure apparatus may include at least one polarization element (51A, 51B) disposed between the light source of the light beam and the second beam splitter. This may allow the polarization state of the light beam to be controlled more precisely.

Moreover, the exposure apparatus may include a ¼ wavelength plate (51A, 51B), disposed between the second beam splitter and an optical member (32) constituting the projection optical system, for setting a polarization state of the light beam to a predetermined state. By causing the light beam to pass through the ¼ wavelength plate in a linear polarization state, the light beam can be applied to the optical member in a circular polarization state.

Moreover, when the at least the part of one of the first object and the projection optical system is illuminated in a rotationally asymmetric light-quantity distribution with the exposure beam, the irradiation mechanism may apply the light beam so as to correct a rotationally asymmetric aberration of the projection optical system generated by the illumination of the exposure beam. This allows the rotationally asymmetric aberration to be corrected.

Moreover, the exposure apparatus may further comprise an aberration correction mechanism (16) which corrects the rotationally symmetric aberration of the projection optical system, and a control unit (24) which controls operations of the irradiation mechanism and aberration correction mechanism to correct an aberration of the projection optical system. The aberration which cannot be corrected by the aberration correction mechanism can be corrected by the irradiation mechanism.

Moreover, a device production method according to the present invention includes a lithography process, and in the lithography process a pattern (11) is transferred onto a photosensitive element (18) using the exposure apparatus of the present invention.

In the above description of the present invention, numerals with a parenthesis given to respective elements correspond to the configurations of embodiments of the present invention described later, however, each numeral is just an exemplification of the element, and it is not intended to limit each element to the configuration of the embodiment.

According to the present invention, in the case where a light quantity distribution of an exposure beam passing through at least a part of optical members of a first object (mask) and a projection optical system is rotationally asymmetric or significantly varies in a radial direction, by irradiating a predetermined portion which has an influence on the aberration, for example, with a light beam different from the exposure beam, a rotationally asymmetric component or a high order component out of the imaging characteristics can be efficiently controlled. Moreover, with the use of a space waveguide mechanism, an optical guide, or a polarization state control mechanism, it is possible for the light beam to be applied to the respective desired irradiation locations easily or in a polarization state in which the light beam is easily absorbed.

Moreover, in the present invention, when the light beam is applied so as to correct the rotationally asymmetric aberration of the projection optical system, the variation of the imaging characteristic of the projection optical system can be suppressed.

BRIEF DESCRIPTION OF THE DRAWINGS

FIG. 3A is a view showing an L&S pattern in an X direction, and FIG. 3B is a view showing a light quantity distribution on a pupil plane of the projection optical system at the time of a dipole illumination in the X direction.

FIG. 4A is a view showing an L&S pattern in a Y direction, and FIG. 4B is a view showing a light quantity distribution on the pupil plane of the projection optical system at the time of a dipole illumination in the Y direction.

FIRST EMBODIMENT

Hereinafter, a preferred first embodiment of the present invention is described with reference to FIGS. 1 to 8.

Figure 1:
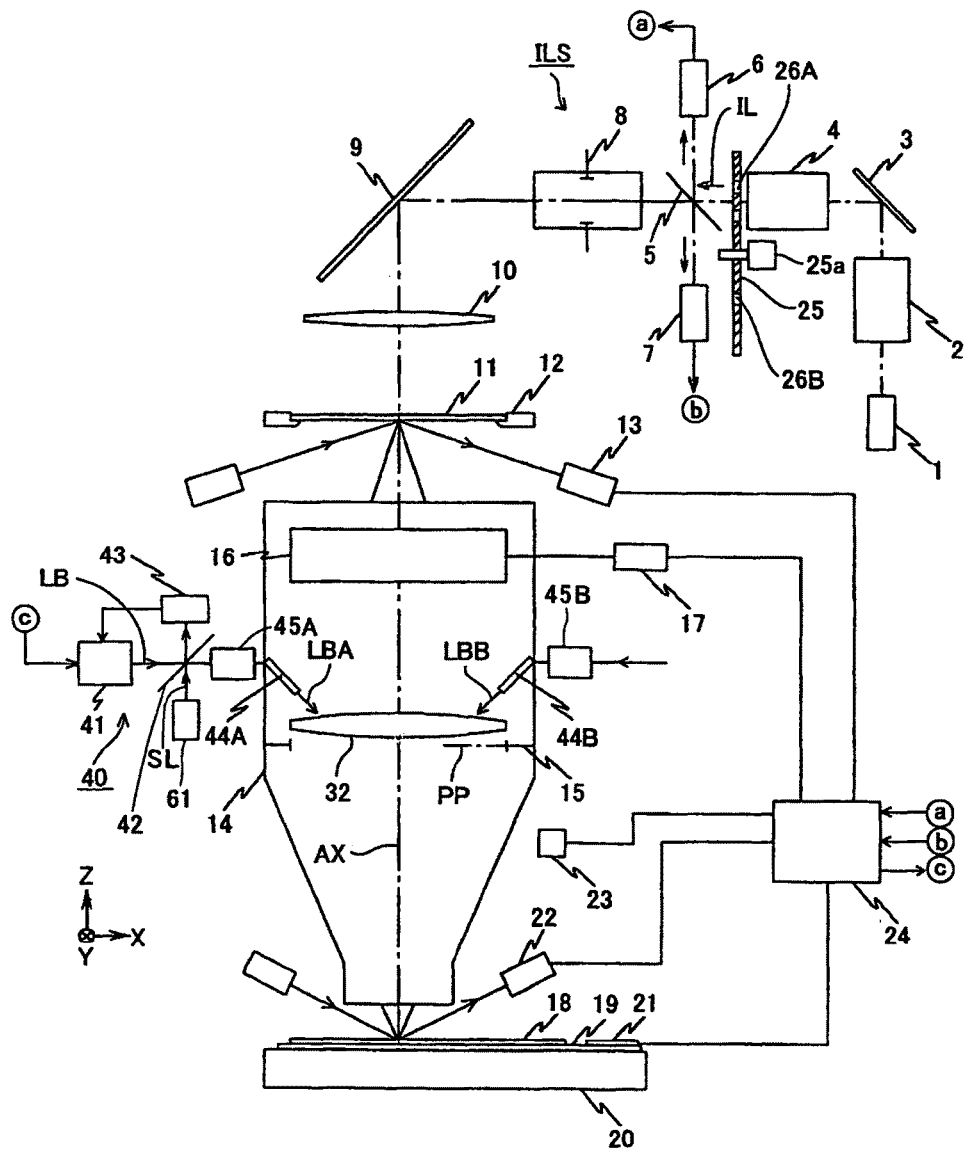
FIG. 1 is a partially cut-out view showing a schematic configuration of a projection exposure apparatus of a first embodiment of the present invention.

FIG. 1 shows a schematic configuration of a projection exposure apparatus of this embodiment, and in FIG. 1 a KrF excimer laser (at a wavelength of 247 nm) is used as an exposure light source 1. Besides, as the exposure light source, a ultraviolet laser light source, such as an ArF excimer laser (at a wavelength of 193 nm), an $F_2$ laser light source (at a wavelength of 157 nm), a $Kr_2$ laser light source (at a wavelength of 146 nm), and an $Ar_2$ laser light source (at a wavelength of 126 nm); a harmonic generation light source of a YAG laser; a harmonic generation apparatus of a solid state laser (semiconductor laser or the like); a mercury lamp (i line or the like), or the like can be used.

An exposure light IL, as the exposure beam outputted from the exposure light source 1 at the time of exposure, the cross sectional shape of the exposure light IL having been shaped into a predetermined shape through a beam shaping optical system (not shown) or the like enters a first fly's eye lens 2 as an optical integrator (uniformizer or homogenizer), whereby the illuminance distribution is uniformized. Then, the exposure light IL emitted from the first fly's eye lens 2 passes through a relay lens (not shown) and a vibrating mirror 3 and enters a second fly's eye lens 4 as an optical integrator, whereby the illuminance distribution is further uniformized. The vibrating mirror 3 is used for the reduction of speckle of the exposure light IL which is a laser beam, and for the reduction of interference fringes by the fly's eye lens. Besides, in place of the fly's eye lenses 2 and 4, a diffractive optical element (DOE), an internal reflection type integrator (rod lens or the like), or the like can be also used.

In the focal plane on the emerging side of the second fly's eye lens 4 (in the pupil plane of the illumination optical system ILS), an illumination system aperture stop member 25 is disposed rotatably by a driving motor 25a for setting the light quantity distribution of the exposure light (secondary light source) to either one of a small circular shape (small σ illumination), a regular circular shape, a plurality of eccentric areas (dipole and quadrupole illumination), an annular form, and the like, thereby determining the illumination condition. A main control system 24 comprised of a computer which controls the entire operation of the apparatus sets the illumination condition by controlling a rotation angle of the illumination system aperture stop member 25 via the driving motor 25a. In the state of FIG. 1, among a plurality of aperture stops (a stops) in the illumination system aperture stop member 25, there are shown an aperture stop 26A used for a first dipole illumination in which two circular openings are formed symmetrically about the optical axis, and an aperture stop 26B used for a second dipole illumination which is in a shape of the aperture stop 26A rotated by 90°. Then, in a focal plane at the emerging side of the second fly's eye lens 4, the aperture stop 26A used for the first dipole illumination is set.

The exposure light IL which passed through the aperture stop 26A in the illumination system aperture stop member 25 enters a beam splitter 5 having a small reflectivity, and the exposure light reflected by the beam splitter 5 is received by a integrator sensor 6 as a first photoelectric sensor through a condenser lens (not shown). The detected signal by the integrator sensor 6 is supplied to a light exposure control section and an imaging characteristic calculation section in the main control system 24, and the light exposure control section calculates indirectly an exposure energy on a wafer 14 using this detected signal and the transmittance of the optical system from the beam splitter 5 to the wafer 18 as a substrate, the transmittance being measured in advance. This light exposure control section controls the output of the exposure light source 1 so that an accumulative exposure energy on the wafer 14 falls within a target range, and when necessary it controls step by step a pulse energy of the exposure light IL using a dimming mechanism (not shown), Then, the exposure light IL which transmitted the beam splitter 5 is incident upon an opening of a field stop 8 through a relay lens (not shown). The field stop 8 actually consists of a fixed field stop (fixed blind) and a movable field stop (movable blind). The latter movable field stop is disposed in a plane which is almost conjugate with a pattern plane (reticle plane) of a reticle 11 as a mask, and the former fixed field stop is disposed in a plane which is slightly defocused from the conjugate plane with this reticle plane. The fixed field stops are used for defining the shape of the illumination area on the reticle 11. The movable field stop is used for enclosing the illumination area in the scanning direction so that the exposure to unnecessary portions may not be carried out at the time of starting and finishing the scanning exposure to each shot area for exposure. Moreover, the movable field stop is also used for defining the center and width in the non-scanning direction in the illumination area as required.

The exposure light IL which passed through the opening of the field stop 8 passes through a condenser lens (not shown), a mirror 9 used for bending an optical path, and a condenser lens 10, and it illuminates the illumination area of the pattern plane (underplane) of the reticle 11 as the mask in a uniform illuminance distribution. The typical shape of the opening of the field stop 8 (here, a fixed field stop) is a rectangular with the aspect ratio of on the order of 1:3 to 1:4, as one example. Then, a typical shape of the illumination area on the reticle 11 which is almost conjugate with the opening is also rectangular.

In FIG. 1, under the exposure light IL, a pattern in the illumination area of the reticle 11 is projected through a both-side telecentric projection optical system 14 to an exposure area on one shot area on the wafer 18 as a substrate (sensitive substrate), to which a photoresist is coated, at a projection magnification of B (B is ¼, ⅕, or the like). This exposure area is a rectangular area which is conjugate with the illumination area on the reticle 11 with respect to the projection optical system 14. The reticle 11 and wafer 18 correspond to the first object and the second object (photosensitive element) of the present invention, respectively. The wafer 18 is, for example, a disk-shaped substrate such as a semiconductor (silicon or the like) or SOI (silicon on insulator) whose diameter is on the order of 200 to 300 mm.

A part of the exposure light IL are reflected by the wafer 18, and the reflected light returns to the beam splitter 5 via the projection optical system 14, the reticle 11, the condenser lens 10, the mirror 9, and the field stop 8, and the light further reflected by the beam splitter 5 is received through a condenser lens (not shown) by an reflection amount sensor (reflectivity monitor) 7 consisting of a photoelectric sensor. The detected signal by the reflection amount sensor 7 is supplied to the imaging characteristic calculation section in the main control system 24. The imaging characteristic calculation section calculates an accumulative energy of the exposure light IL which enters the projection optical system 14 from the reticle 11, and an accumulative energy of the exposure light IL which is reflected by the wafer 18 and returns to the projection optical system 14, using the detected signals of the integrator sensor 6 and the reflection amount sensor 7. Moreover, information on the illumination condition (i.e., the type of the illumination system aperture stop) during exposure is also supplied to the imaging characteristic calculation section. Furthermore, an environmental sensor 23 for measuring the atmospheric pressure and temperature is disposed on the outside of the projection optical system 14, and the measured data of the environmental sensor 23 is also supplied to the imaging characteristic calculation section. The imaging characteristic calculation section in the main control system 24 calculates the variation amount of the rotationally symmetric aberration component and the rotationally asymmetric aberration component in the imaging characteristic of the projection optical system 14, using the information, such as the illumination condition, the accumulation energy of the exposure light IL, and the ambient atmospheric pressure and temperature. In the main control system 24, an imaging characteristic control section is also provided, and in response to the calculation result of the variation amount of the aberration component, the imaging characteristic control section suppresses the variation amount of the imaging characteristic so as to obtain a desired imaging characteristic all the time (see details below).

The illumination optical system ILS consists of the exposure light source 1, the fly's eye lenses 2 and 4, the mirrors 3 and 9, the illumination system aperture stop member 25, the field stop 8, the condenser lens 10, and the like. Furthermore, the illumination optical system ILS is covered with a sub-chamber (not shown) as an airtight chamber. In order to keep transmittance with respect to the exposure light IL high, a dried air in which impurities are removed to a high extent (a nitrogen gas, a helium gas, or the like is also used when the exposure light is an ArF excimer laser) is supplied into the sub-chamber and into a lens barrel of the projection optical system 14.

Moreover, the projection optical system 14 of this example is a refraction system, and a plurality of optical members constituting the projection optical system 14 includes a plurality of lenses made of quartz (fluorite, or the like is also used when the exposure light is an $F_2$ laser) which is rotationally symmetric about the optical axis AX, a plate-shaped aberration correction plate made of quartz, and the like. Then, in a pupil plane PP (i.e., a conjugate plane with the pupil plane of the illumination optical system ILS) of the projection optical system 14, an aperture stop 15 is disposed, and in the vicinity of the pupil plane PP a lens 32 as a predetermined member which has an influence on the aberration is disposed. The lens 32 is irradiated with a rotationally asymmetric aberration correcting irradiation light (light beam) in a wavelength range different from that of the exposure light IL (see details below). Moreover, an imaging characteristic correction mechanism 16 for correcting the rotationally symmetric aberration is incorporated in the projection optical system 14, and the imaging characteristic control section in the main control system 24 controls the operation of the imaging characteristic correction mechanism 16 via a control section 17.

Figure 2:
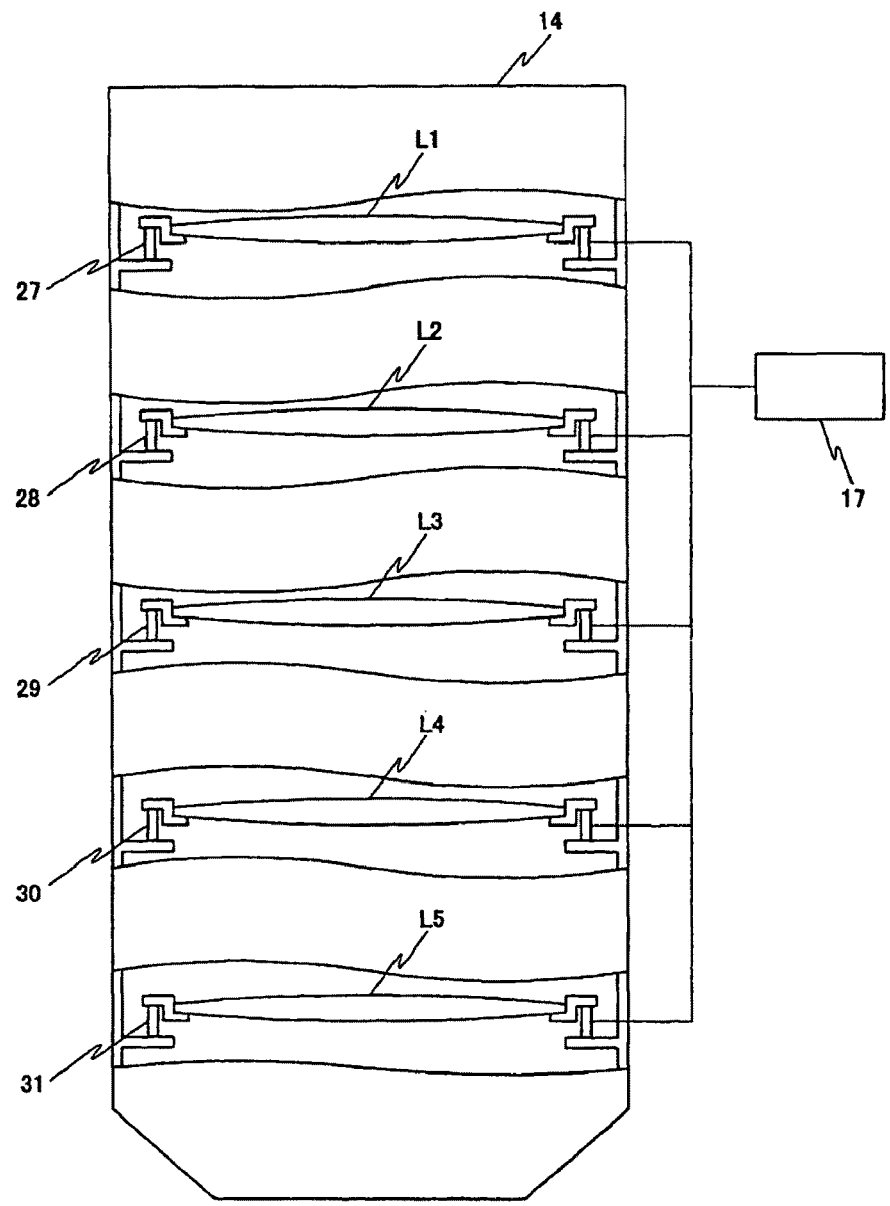
FIG. 2 is a partially cut-out view showing an example of the configuration of an imaging characteristic correction mechanism 16 in FIG. 1.

FIG. 2 shows an example of the imaging characteristic correction mechanism 16 (aberration correction mechanism) in FIG. 1. In FIG. 2, in the lens barrel of the projection optical system 14, for example, five lenses L1, L2, L3, L4, and L5 selected among a plurality of optical members are held via the driver elements 27, 28, 29, 30, and 31 which are independently retractable and stretchable in the three optical axis directions, respectively. In front and in rear of the lenses L1 to L5, fixed lenses and aberration correction plates (not shown) are also disposed. In this case, three driver elements 27 (only two pieces are shown in FIG. 2) are disposed in a positional relationship of substantially vertices of an equilateral triangle, and similarly, other driver elements 28 to 31 each having three driver elements are also disposed in a positional relationship of substantially vertices of an equilateral triangle, respectively. As the retractable and stretchable driver elements 27 to 31, a piezoelectric device, a magnetostrictive device, an electric micrometer, or the like can be used, for example. The control section 17 can independently control the position of the five lenses L1 to L5 in the respective optical axis directions, and the inclining angles about two orthogonal axes perpendicular to the optical axis, by independently controlling the retracting/stretching amount of every three driver elements 27 to 31 based on the control information from the imaging characteristic control section in the main control system 24. Accordingly, the predetermined rotationally symmetric aberration in the imaging characteristic of the projection optical system 14 can be corrected.

Specifically, by controlling the position and inclining angle in the optical axis direction of the lens L1 or L5 at the position in the vicinity of the reticle or the wafer, the distortion aberration (including magnification error) or the like can be corrected, for example. Moreover, by controlling the position in the optical axis direction of the lens L3 at the position in the vicinity of the pupil plane of the projection optical system 14, spherical aberration or the like can be corrected. Note that the lens L3 to be driven in FIG. 2 may be the same as the lens 32 which is irradiated with the aberration correcting irradiation light in the projection optical system 14 of FIG. 1. The mechanism for driving the lens or the like in the projection optical system 14 in this way is disclosed also in Japanese Patent Application Laid-open No. 4-134813, for example. Moreover, in place of the optical members in the projection optical system 14, or together with these optical members, the position in the optical axis direction of the reticle 11 of FIG. 1 may be controlled to correct the predetermined rotationally symmetric aberration. Furthermore, as the imaging characteristic correction mechanism 16 of FIG. 1, a mechanism which controls the pressure of gas in a sealed space of between two predetermined lenses in the projection optical system 14 may be used, as disclosed in Japanese Patent Application Laid-open No. 60-78454, for example.

Back to FIG. 1, in the following description, a Z-axis is in parallel with the optical axis AX of the projection optical system 14, and in a plane perpendicular to the Z-axis, a scanning direction (i.e., a direction perpendicular to a paper sheet of FIG. 1) of the reticle 11 and wafer 18 at the time of scanning exposure is defined as a Y-axis, and a non-scanning direction perpendicular to the scanning direction is defined as an X-axis. First, the reticle 11 is adsorbed and held onto the reticle stage 12 and the reticle stage 12 moves in the Y direction on a reticle base (not shown) at a constant speed, and it finely moves in the X direction, the Y direction, and a rotation direction so as to correct synchronization error, thereby scanning the reticle 11. The position and rotation angle in the X direction and the Y direction of the reticle stage 12 are measured by a moving mirror (not shown) and a laser interferometer (not shown) which are provided thereabove, and this measured value is supplied to the stage control section in the main control system 24. The stage control section controls the position and speed of the reticle stage 12 based on the measured value and various control information. In the upper side plane of the projection optical system 14, there is disposed an auto-focusing sensor 13 of an obliquely incident type (hereinafter, referred to as a "reticle side AF sensor") in which a slit image is projected obliquely to the pattern plane (reticle plane) of the reticle 11, and the reflected light from the reticle plane is received to re-image the slit image, and from the horizontal deviation amount of the slit image the displacement in the Z direction of the reticle plane is detected. The detected information by the reticle side AF sensor 13 is supplied to a Z-tilt stage control section in the main control system 24. Moreover, above the periphery of the reticle 11, a reticle alignment microscope used for reticle alignment (not shown) is disposed.

On the other hand, the wafer 18 is adsorbed and held onto a Z-tilt stage 19 via a wafer holder (not shown), the Z-tilt stage 19 is fixed on the wafer stage 20, and the wafer stage 20 moves in the Y direction on a wafer base (not shown) at a constant speed and stepwisely moves in the X direction and the Y direction. Moreover, the Z-tilt stage 19 controls the position in the Z direction of the wafer 18, and the inclining angles about the X-axis and Y-axis. The position and rotation angle in the X direction and the Y direction of the wafer stage 20 are measured by the laser interferometer (not shown), and the measured value is supplied to the stage control section in the main control system 24. This stage control section controls the position and speed of the wafer stage 20 based on the measured value and various control information. In the lower side plane of the projection optical system 14, there is disposed an auto-focusing sensor 22 of an obliquely incident type (hereinafter, referred to as a "wafer side AF sensor") in which a plurality of slit images is projected obliquely to the surface (wafer plane) of the wafer 18, and the reflected light from the wafer plane is received to re-image the slit image, and from the horizontal deviation amount of these slit images the displacement (defocusing amount) and the inclining angle in the Z direction of the plane are detected. The detected information by the wafer side AF sensor 22 is supplied to the Z-tilt stage control section in the main control system 24, and the Z-tilt stage control section drives the Z-tilt stage 19 using the auto-focusing system based on the detected information of the reticle side AF sensor 13 and the wafer side AF sensor 22, so that the wafer plane may always be focused in the image plane of the projection optical system 14.

Moreover, in the vicinity of the wafer 18 on the Z-tilt stage 19, an irradiation amount sensor 21 consisting of a photoelectric sensor is fixed, the irradiation amount sensor 21 being provided with a light receiving plane covering the entire exposure area of the exposure light IL, and the detected signal of the irradiation amount sensor 21 is supplied to the light exposure control section in the main control system 24. Before starting exposure or periodically, the light receiving plane of the irradiation amount sensor 21 is illuminated with the exposure light IL after having been moved to the exposure area of the projection optical system 14, and the detected signal of the irradiation amount sensor 21 is divided by the detected signal of the integrator sensor 6, thereby the light exposure control section calculates the transmittance of the optical system from the beam splitter 5 to the irradiation amount sensor 21 (wafer 18) and stores the same.

Furthermore, above the wafer stage 20 there is disposed an off-axis type alignment sensor (not shown) used for wafer alignment, and based on the detected results of the reticle alignment microscope and the alignment sensor described above, the main control system 24 carries out the alignment of the reticle 11 and the alignment of the wafer 18. At the time of exposure, while the illumination area on the reticle 11 is being illuminated with the exposure light IL, the following two operations are repeated: an operation of synchronously scanning the reticle 11 and one shot area on the wafer 18 in the Y direction by driving the reticle stage 12 and the wafer stage 20; and an operation of stepwisely moving the wafer 18 in the X direction and the Y direction by driving the wafer stage 20. Through these operations, a pattern image of the reticle 11 is exposed onto each shot area on the wafer 18 using a step and scan method.

Now, in this example, in order to carry out a dipole illumination, in the pupil plane of the illumination optical system ILS of FIG. 1 there is disposed the aperture stop 26A having two openings spaced apart in the direction corresponding to the X direction. In this case, the main pattern for transfer formed in the reticle 11 is a line-and-space pattern (hereinafter, referred to as an "L&S pattern") in the X direction 33V, as enlargedly shown in FIG. 3A as an example, wherein long and slender line patterns in the Y direction are arrayed in the X direction (non-scanning direction) with a pitch almost close to the resolution limit of the projection optical system 14. In this case, usually there are also formed on the reticle 11 another plurality of L&S patterns or the like having the array directions of the X direction and the Y direction (scanning direction) at an array pitch larger than that of the L&S pattern 33V.

Like in this example, in a dipole illumination in the X direction using the aperture stop 26A, assuming that no reticle is present, as shown in FIG. 3B, in the pupil plane PP of the projection optical system 14, two circular areas 34, which are symmetrical in the X direction across the optical axis AX, are illuminated with the exposure light IL. Moreover, also in the case where various reticle patterns are disposed in the optical path of the exposure light IL, because usually the light quantity of the 0th order light is quite large as compared with the light quantity of the diffracted light and the diffraction angle is also small, the majority of the exposure light IL (imaging light flux) passes through the circular area 34 or the vicinity thereof. Moreover, when the reticle 11 of FIG. 3A is disposed in the optical path of the exposure light IL like in this example, ±1st order diffracted lights from the L&S pattern 33V with a pitch close to the resolution limit also pass through the almost circular area 34 or the vicinity thereof, and therefore, the image of the L&S pattern 33V can be projected onto the wafer at high resolution.

Figure 5:
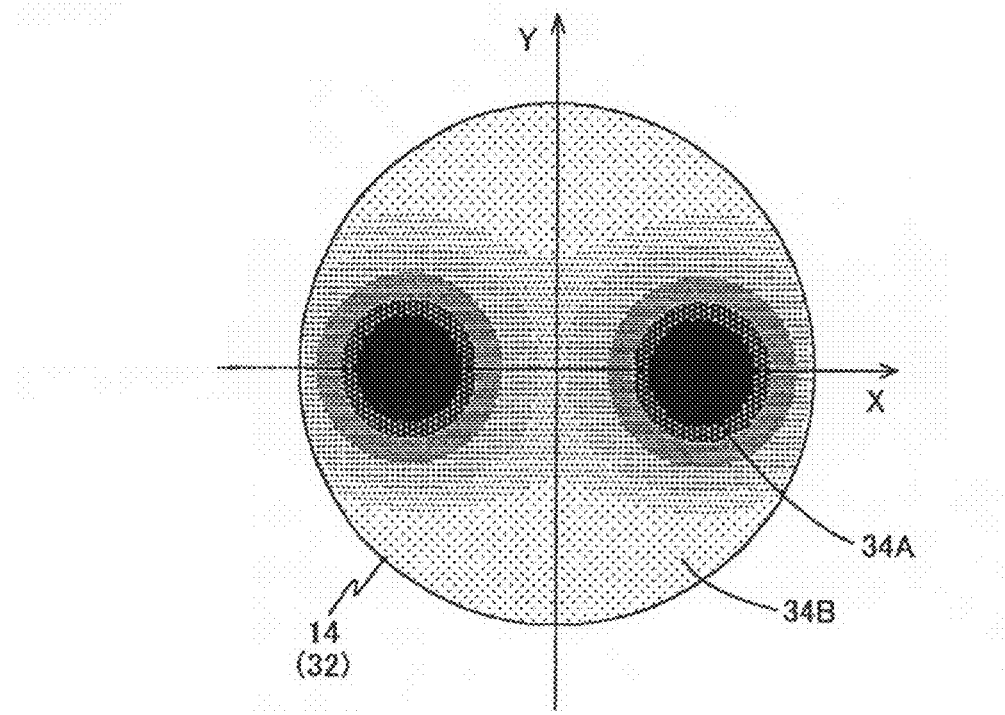
FIG. 5 is a view showing a temperature distribution of a lens at the time of a dipole illumination in the X direction.

Under this condition, the light quantity distribution of the exposure light IL, which enters the lens 32 in the vicinity of the pupil plane PP of the projection optical system 14 of FIG. 1, is also nearly equal to the light quantity distribution of FIG. 3B. Therefore, if the exposure is continued, the temperature distribution of the lens 32 in the vicinity of the pupil plane PP becomes such that the temperature is the highest in two circular areas 34A, which sandwich the optical axis in the X direction, and it decreases gradually toward a peripheral area 34B thereof, as shown in FIG. 5, and in response to the temperature distribution the lens 32 thermally expands (deforms by heat) and the refractive index distribution also varies. As a result, the refractive power increases with respect to the light beam opened in the Y direction in the lens 32, while the refractive power decreases with respect to the light beam opened in the X direction. For this reason, the center astigmatism $\Delta Z$ which is an astigmatic aberration on the optical axis is generated. This center astigmatism $\Delta Z$ increases gradually with time and is saturated at a predetermined value. This is because the temperature of the lens 32 is saturated.

Under this condition, if there is formed on the reticle 11 an L&S pattern arrayed at a predetermined pitch in the Y direction other than the L&S pattern 33V in the X direction, and if the image plane of the L&S pattern 33V in the X direction is focused with respect to the wafer plane, then a blur due to defocus arises in the image of the L&S pattern in the Y direction.

On the other hand, as enlargedly shown in FIG. 4(A), assume that there is formed an L&S pattern 33H in the Y direction, wherein line patterns which are long and slender mainly in the X direction on the reticle 11 are arrayed in the Y direction (scanning direction) at a pitch almost close to the resolution limit of the projection optical system 14. In this case, in the pupil plane of the illumination optical system ILS of FIG. 1, the aperture stop 26B in a form of the aperture stop 26A rotated by 90° is set. In a dipole illumination in the Y direction using the aperture stop 26B, assuming that no reticle is present, as shown in FIG. 4B, in the pupil plane PP of the projection optical system 14 two circular areas 35 which are symmetrical in the Y direction across the optical axis AX are illuminated with the exposure light IL. In this case, even if various reticle patterns are disposed in the optical path of the exposure light IL, the majority of the exposure light IL (imaging light flux) usually passes through the circular area 35 and the vicinity thereof. Moreover, if the reticle 11 of FIG. 4A is disposed in the optical path of the exposure light IL, ±1st order diffracted lights from the L&S pattern 33H with a pitch close to the resolution limit also pass through the almost circular area 35 or the vicinity thereof, and therefore, the image of the L&S pattern 33H can be projected onto the wafer at high resolution.

In this case, the light quantity distribution of the exposure light IL which enters the lens 32 in the vicinity of the pupil plane PP of the projection optical system 14 of FIG. 1 is also nearly equal to the light quantity distribution of FIG. 4B. Therefore, if the exposure is continued, the temperature distribution in the lens 32 becomes that of the distribution of FIG. 5 rotated by almost 90°, and in the projection optical system 14 the center astigmatism will generate, which has the opposite sign and almost the same magnitude as in the case of using the dipole illumination of FIG. 3B. In addition, in this embodiment, because the reticle 11 is illuminated in a rectangular illumination area with the X direction (non-scanning direction) being the longitudinal direction, the center astigmatism originating from this illumination area also always arises slightly with the same sign as in the case of using the dipole illumination of FIG. 3B. On the other hand, as for the center astigmatism which arises in the dipole illumination of FIG. 4B, the sign becomes opposite to that of the center astigmatism originating from the rectangular illumination area, and the center astigmatism as a whole becomes slightly smaller than the case of using the dipole illumination of FIG. 3B.

These center astigmatism's are rotationally asymmetric aberrations and also other rotationally asymmetric aberration arises due to the dipole illumination, however, these rotationally asymmetric aberrations cannot be substantially corrected by the imaging characteristic correction mechanism 16 of FIG. 1. Moreover, also in the case where other rotationally asymmetric illumination conditions are used, rotationally asymmetric aberration arises. Furthermore, in the case where the light quantity distribution of the exposure light IL in the pupil plane (pupil plane of the projection optical system 14) of the illumination optical system varies significantly in the radial direction like in the case where a small σ illumination is carried out, a high order rotationally symmetric aberration such as a high order spherical aberration may occur, which cannot be corrected excellently by the imaging characteristic correction mechanism 16. So, in this example, in order to correct the rotationally asymmetric aberration or a high order rotationally symmetric aberration, in FIG. 1 the lens 32 in the vicinity of the pupil plane PP of the projection optical system 14 is irradiated with aberration correcting irradiation lights (corresponding to the light beam, and hereinafter referred to as a "correcting light") LBA and LBB having a wavelength range different from that of the exposure light IL (exposure beam). Hereinafter, a configuration of the correcting light irradiation mechanism 40 (irradiation mechanism for irradiating with a light beam) for irradiating the lens 32 with these correcting lights LBA and LBB, and an operation of correcting the aberration are described in detail.

[Description of the Correcting Light Irradiation Mechanism]

In this embodiment, as the correcting lights LBA and LBB, a light having a wavelength range which hardly exposes the photoresist coated to the wafer 18 is used. As one example, as the correcting lights LBA and LBB, an infrared light at a wavelength of 10.6 μm, for example, which is emitted from a $CO_2$ laser ($CO_2$ laser), is used. This infrared light at a wavelength of 10.6 μm has a high absorptivity with respect to quartz and is almost totally (preferably, 90% or more) absorbed by one lens in the projection optical system 14, and therefore, there is an advantage that it is easy to use for controlling aberration without affecting other lenses. Specifically, the correcting light LB to irradiate the lens 32 of this embodiment is set as to be absorbed by 90% or more.

Furthermore, as the $CO_2$ laser in this embodiment, an RF (Radio Frequency) excited waveguide type $CO_2$ laser is used. The RF excited waveguide type $CO_2$ laser is advantageous in that by using electric discharge excitation in a radio frequency region, it is possible to attain a smaller size and more robustness as compared with the conventional direct-current-discharge excitation type $CO_2$ laser and in that it is easy to use. Moreover, generally, the RF excited waveguide type $CO_2$ laser is of a continuous oscillation (CW), however, as the control of the output of the laser (irradiation amount of the correcting light), the so-called duty ratio control can be used in which the oscillation time is controlled relative to the quiescent time. Furthermore, generally, the polarization state of the laser beam emitted from the laser light source is linearly polarized, and the correcting lights LBA and LBB of this embodiment are linearly polarized immediately after being emitted from the $CO_2$ laser. Besides, as the correcting lights LBA and LBB, a near-infrared light at a wavelength of approximately 1 μm emitted from a solid state laser such as a YAG laser, or an infrared light at a wavelength of several μm emitted from a semiconductor laser can also be used.

In the correcting light irradiation mechanism 40 shown in a simplified manner in FIG. 1, at the time of aberration correction the correcting light LB consisting of a linearly polarized laser beam with a wavelength of 10.6 μm, the laser beam being emitted from a light source system 41 which includes a $CO_2$ laser, enters a beam splitter 42 having a small reflectivity, and the correcting light which transmitted the beam splitter 42 enters an irradiation unit 45A through a light directing optical system (not shown). The light emitting timing and output in the light source system 41 are controlled by the correcting light control section in the main control system 6. Then, the correcting light LB having been through the irradiation unit 45A passes through a waveguide 44A as a space waveguide mechanism, which is disposed so as to penetrate the lens barrel of the projection optical system 14, and it is incident obliquely on the lens 32 as a correcting light LBA.

On the other hand, a part of the correcting light reflected by the beam splitter 42 is received by a photodetector 43 (photoelectric sensor), and the detected signal by the photodetector 43 is fed back to the light source system 41. Moreover, in this example, a semiconductor laser light source 61 (laser diode) is disposed so as to face the photodetector 43 across the beam splitter 42, and a laser beam SL of visible light at a wavelength of 670 nm emitted from the semiconductor laser light source 61 is also incident to the beam splitter 42. A part of the irradiating laser beam SL is reflected by the beam splitter 42 and combined coaxially with the correcting light LB, and thereafter it irradiates, together with the correcting light LBA, the lens 32 through the light directing optical system (not shown), the irradiation unit 45A, and the waveguide 44A. In this case, the laser beam SL in a visible region is used as a guide light for adjusting the optical axis or the like of the correcting light LBA of an infrared region, for example, at the time of assembly-adjustment of the correcting light irradiation mechanism 40 or at the time of maintenance. Therefore, in irradiating the lens 32 with the correcting light LBA at the time of the regular exposure, the semiconductor laser light source 61 stops emitting light and thus the laser beam SL is not irradiated. Because the laser beam SL is not used at the time of aberration correction as described above, the illustration thereof is omitted except in FIG. 1.

Moreover, the waveguide 44B is disposed almost symmetrically with the waveguide 44A across the optical axis AX, and the correcting light supplied from a light source system and a light directing optical system, which are not shown, irradiates the lens 32 through the irradiation unit 45B and the waveguide 44B as a correcting light LBB. Moreover, actually, another pair of waveguides is disposed so as to sandwich the optical axis AX in the Y direction, and also from these waveguides the correcting lights irradiate the lens 32, respectively (see details below).

Figure 6:
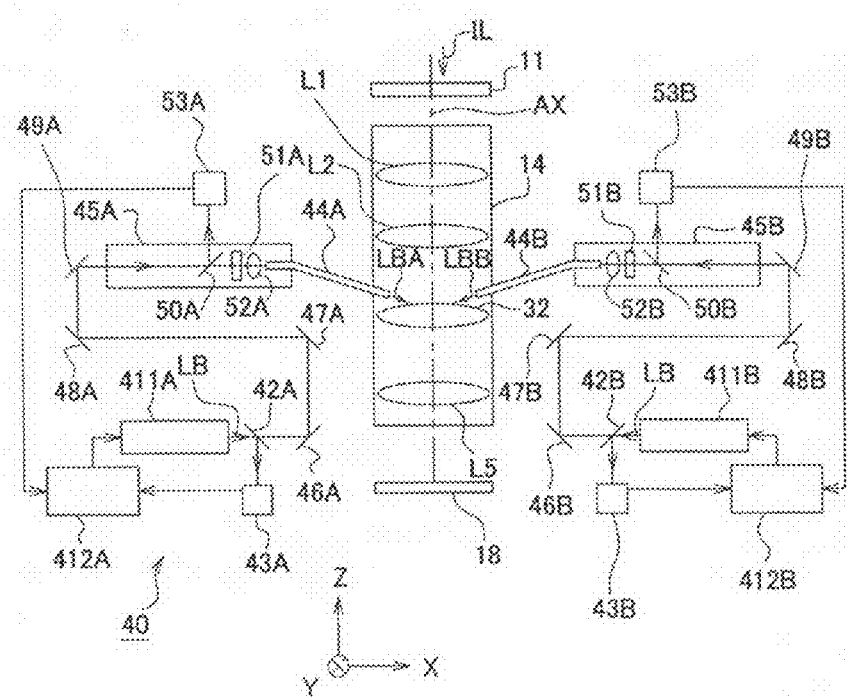
FIG. 6 is a view showing a configuration of a correcting light irradiation mechanism 40 of the first embodiment of the present invention.

Next, FIG. 6 shows a detailed configuration of the correcting light irradiation mechanism 40 of FIG. 1, and in FIG. 6, the light source system 41 of FIG. 1 is comprised of an RF excited waveguide type $CO_2$ laser 411A and a laser power supply 412A. The beam splitter 42 and photodetector 43 of FIG. 1 correspond to a beam splitter 42A and a photodetector 43A, respectively. In FIG. 6, a part of the correcting light LB with a linear polarization emitted from the $CO_2$ laser 411A is split by the beam splitter 42A and received by the photodetector 43A, and this detected signal is fed back to the laser power supply 412A. The correcting light LB which transmitted the beam splitter 42A is reflected by four mirrors 46A, 47A, 48A, and 49A sequentially, and it enters the irradiation unit 45A. Four mirrors 46A to 49A constitute a light directing optical system. Because the light directing optical system of this embodiment is a reflective system, the polarization state of the correcting light LB is kept to be a linear polarization.

In the irradiation unit 45A, the incident correcting light LB enters a beam splitter 50A (second beam splitter) having a small reflectivity, and the correcting light reflected and split by the beam splitter 50A is received by the photodetector 53A (photoelectric sensor), and this detected signal is fed back to the laser power supply 412A. The laser power supply 412A controls the light emitting timing and output (irradiation amount) of the $CO_2$ laser 411A based on the detected signal of the photodetectors 43A and 53A and the control information from the correcting light control section in the main control system 24 of FIG. 1. In this case, a conversion factor for calculating the light quantity (for example, illuminance) of the correcting light LBA to be emitted from the waveguide 44A is determined in advance from the light quantity received (detected signal) at the photodetector 53A with high precision, and it is stored in a storage section in the laser power supply 412A. From the correcting light control section, the light emitting timing of the $CO_2$ laser 411A and the light quantity (or the irradiation amount) on the lens 32 are indicated. Moreover, the detected signal from the photodetector 43A is used for the monitoring of the oscillation condition of the $CO_2$ laser 411A and for the failure detection of the optical components from the beam splitter 42A to the beam splitter 50A.

The correcting light LB with a linear polarization which transmitted the beam splitter 50A passes through the ¼ wavelength plate 51A corresponding to the phase plate as the polarization state control mechanism and is converted into a circular polarization light, and thereafter, it is condensed to an incident port of a hollow waveguide 44A by a condenser lens 52A. The waveguide 44A is a narrow tube whose cross sectional interior plane is circular, the narrow tube being made of glass, ceramics, or metal, as one example, wherein the inner wall of the narrow tube is coated with a material having a high reflectivity in the wavelength of the correcting light LB ($CO_2$ laser beam). The inner diameter of the waveguide 44A is approximately 0.2 to 2 mm, as one example. Similarly, the reflective planes of the mirrors 46A to 49A are also coated with a reflective film having a high reflectivity at the wavelength of the correcting light LB. In this embodiment, as described with reference to FIG. 1, the laser beam SL in a visible region is also used as the guide light with respect to the correcting light LB. Then, a film having a high reflectivity at both wavelengths of the correcting light LB and the laser beam SL (guide light) is coated to the reflective planes of the mirrors 46A to 49A and to the inner plane of the waveguide 44A.

The hollow waveguide 44A reaches an obliquely upper part of the lens 32 in the projection optical system 14 through the lens barrel of the projection optical system 14. Then, the correcting light LB which propagated in the waveguide 44A by internal reflections is obliquely and directly incident upon the surface of the lens 32 as the correcting light LBA. In this case, because the correcting light LB which enters the waveguide 44A through the ¼ wavelength plate 51A is circularly polarized, the correcting light LBA to irradiate the lens 32 from the waveguide 44A is also an almost stable circular polarization light. Material constituting the optical lenses such as the lens 32 is dielectric in general, and the reflectivity of the dielectric material depends on the polarization characteristic of the incident light. Then, the correcting light LBA whose polarization characteristic is stable, the correcting light LBA having been emitted from the waveguide 44A, is stably absorbed by the lens 32 to heat the lens 32 locally. Besides, if the polarization characteristic thereof in the waveguide 44A is stable, a ½ wavelength plate can also be used in place of the ¼ wavelength plate 51A. In this case, the crystal orientation of the ½ wavelength plate only needs to be determined so that the percentage of the polarization state, in which the correcting light LBA emitted from the waveguide 44A is absorbed effectively by the lens 32, may become the maximum.

In FIG. 6, in this embodiment, an optical system for irradiating other area of the lens 32 with a correcting light LBB from a waveguide 44B is disposed which is controllable in parallel with and also independently from the optical system (from the $CO_2$ laser 411A through the condenser lens 52A) for irradiating the lens 32 with the correcting light LBA from the waveguide 44A. Namely, there are disposed: the $CO_2$ laser 411A, the beam splitter 42A, the laser power supply 412A, the photodetector 43A, the mirrors 46A to 49A, the irradiation unit 45A (the beam splitter 50A, the ¼ wavelength plate 51A and the condenser lens 52A), the photodetector 53A and the waveguide 44A; and almost symmetrically with those there are disposed: a $CO_2$ laser 411B, a beam splitter 42B, a laser power supply 412B, a photodetector 43B, mirrors 46B to 49B (optical system for guiding light), an irradiation unit 45B (a beam splitter 50B, a ¼ wavelength plate 51B, and a condenser lens 52B), a photodetector 53B, and a waveguide 44B. Then, the correcting light LB with a linear polarization emitted from the $CO_2$ laser 411B irradiates the lens 32 through the waveguide 44B as the correcting light LBB with a stable circular polarization.

Figure 7:
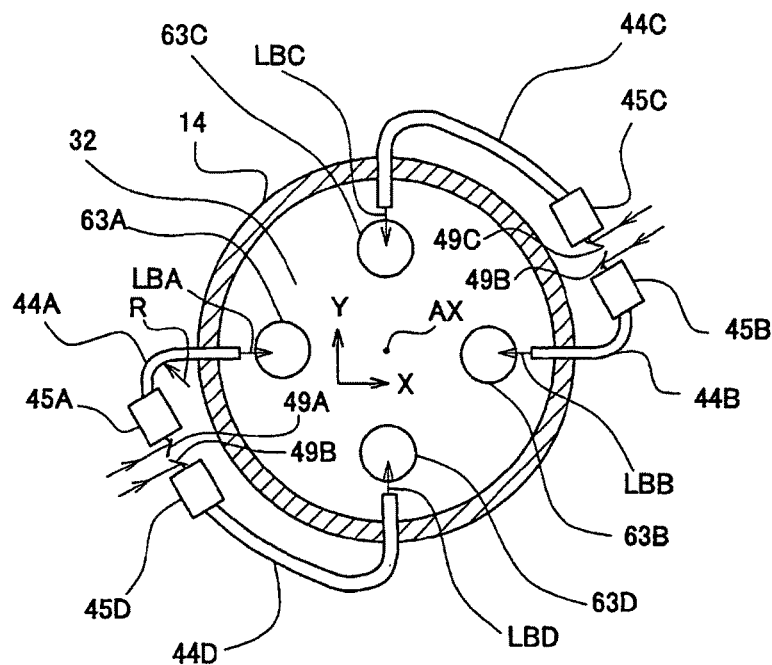
FIG. 7 is a plan view of a projection optical system 14 cut out along waveguides 44A and 44B of FIG. 6.

FIG. 7 is a plan view of the projection optical system 14 cut out by a horizontal plane including the waveguides 44A and 44B of FIG. 6, and in FIG. 7 the emitting ports of a pair of hollow waveguides 44A and 44B are disposed through the lens barrel of a projection optical system PL so as to sandwich the optical axis AX in the X direction. Moreover, the emitting ports of another pair of hollow waveguides 44C and 44D are disposed through the lens barrel of the projection optical system PL so as to sandwich the optical axis AX in the Y direction. Moreover, the incident ports of the waveguides 44C and 44D are linked with the irradiation units 45C and 45D having the same configuration as the irradiation unit 45A, respectively. To the irradiation units 45C and 45D, the correcting lights are supplied from another pair of optical systems through the mirrors 49C and 49D, respectively, a pair of optical systems being the same as the optical system from the $CO_2$ laser 411A to the mirror 48A of FIG. 6. In this case, the correcting lights LBA and LBB from the waveguides 44A and 44B irradiate two almost circular areas 63A and 63B, respectively, which sandwich the optical axis AX on the lens 32 in the X direction. Then, the correcting lights LBC and LBD from the waveguides 44C and 44D irradiate two almost circular areas 63C and 63D, respectively, which sandwich the optical axis AX on the lens 32 in the Y direction.

That is, with respect to the lens 32, the correcting lights LBA to LBD can irradiate totally four areas 63A to 63D (i.e., two places in the ±X direction, and two places in the ±Y direction about the optical axis AX as a center), selectively at a desired timing and with a desired irradiation amount (irradiation time duration), respectively. In this case, two irradiation units 45A and 45D are disposed adjacently, and the waveguides 44A and 44D from the irradiation units 45A and 45D are gradually bent to be disposed along the lens barrel of the projection optical system 14. In the same way, other two irradiation units 45B and 45C are also disposed adjacently, and the waveguides 44B and 44C from the irradiation units 45B and 45C are also gradually bent to be disposed along the lens barrel of the projection optical system 14. The minimum value of the radius of curvature R of four waveguides 44A, 44B, 44C, and 44D is set to more than or equal to a value (for example, on the order of 30 mm) where the transmittance of the correcting lights passing through the inside thereof, respectively, will slightly decrease. Accordingly, the optical system for irradiating with the correcting lights LBA to LBD can be disposed around the lens barrel of the projection optical system 14 compactly.

Note that, in FIG. 6, in order to increase the percentage of a circular polarization state in the correcting lights LBA and LBB obtained by the ¼ wavelength plates 51A and 51B, a polarization plate for making the correcting lights which enter the ¼ wavelength plates 51A, 51B more perfect linear polarization lights may be disposed in between the mirrors 49A, 49B and the ¼ wavelength plates 51A, 51B, for example.

Moreover, although in this embodiment the correcting lights supplied to four waveguides 44A to 44D are generated in the mutually independent optical systems, four lights which are split from a laser beam emitted from one common laser light source may be supplied to these four waveguides 44A to 44D in parallel.

Moreover, in order to carry out aberration correction with higher precision, other configuration may be possible so that the correcting light may irradiate the lens 32 selectively in eight or more areas with an almost equiangular interval about the optical axis AX, for example.

[Method for irradiating a correcting light under a rotationally asymmetric illumination condition, or the like]

Next, with respect to a method for irradiating a correcting light under a rotationally asymmetric illumination condition, the case where the center astigmatism which arises in a dipole illumination is corrected is described as an example. Because in this embodiment a dipole illumination in the X direction is carried out, as shown in FIG. 3B the exposure light IL illuminates two circular areas 34 which sandwich the optical axis AX in the X direction on the pupil plane PP of the projection optical system 14.

Figure 8:
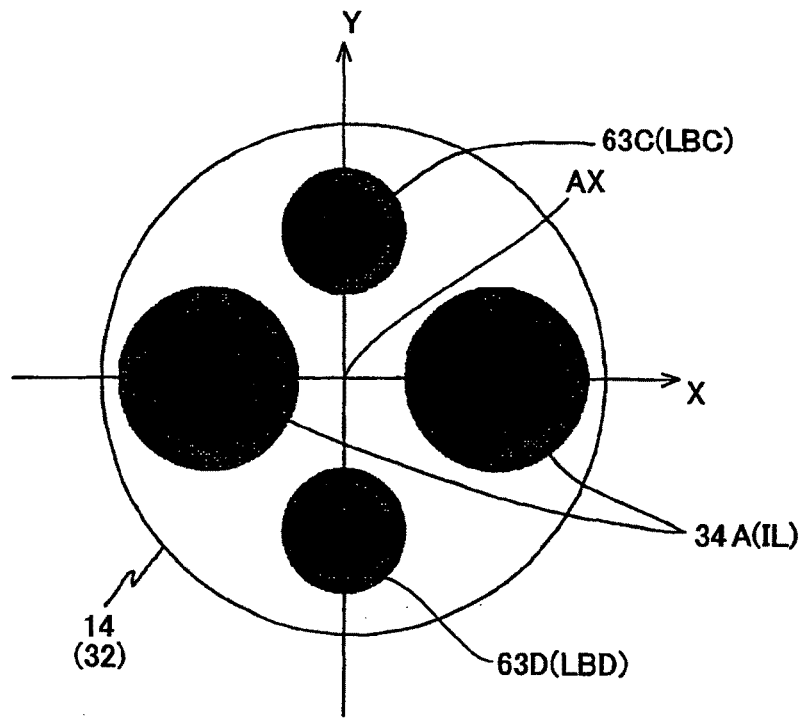
FIG. 8 is a plan view showing an irradiation area of an exposure light and a correcting light with respect to a lens at the time of a dipole illumination in the X direction in the first embodiment of the present invention.

FIG. 8 is a plan view showing the lens 32 in the vicinity of the pupil plane PP of the projection optical system 14, and in FIG. 8 the exposure light IL illuminates areas 34A which sandwich the optical axis AX on the lens 32 symmetrically in the X direction, and the neighboring areas thereof. In this example, the correcting lights LBC and LBD irradiate a pair of almost circular areas 63C and 63D on the lens 32 through the waveguides 44C and 44D of FIG. 7, respectively, wherein the pair of almost circular areas 63C and 63D is the area which rotated the area 34A by almost 90° about the optical axis AX.

By irradiating the areas, which are the illumination areas of the exposure light IL rotated by 90°, with the correcting lights LBC and LBD, the temperature distribution of the lens 32 becomes high in the areas 34A and the areas 63C and 63D, and it becomes lower gradually as leaving away therefrom. As a result, as compared with the deformation of the lens 32 in the case of illumination only by the exposure light IL, the deformation conditions of the lens 32 of this embodiment, which in addition to the exposure light IL correcting lights LBC, LBD irradiate, are similar in the non-scanning direction and in the scanning direction. Therefore, the focal positions with respect to the light fluxes opened in the X direction and in the Y direction are almost mutually equal, and thus the center astigmatism will scarcely generate. This improves the imaging characteristic of the projection optical system 14, and all the patterns on the reticle 11 are transferred onto the wafer 18 with high precision.

The irradiation amount (dose) and irradiation timing of the correcting lights LBC and LBD in this case can be defined as follows, as an example. That is, the imaging characteristic calculation section in the main control system 24 of FIG. 1 can calculate the amount of heat energy, which is accumulated in the lens 32 by the exposure light IL passing through the areas 34A and its neighboring areas on the lens 32 of FIG. 8, from the information on the accumulative energy of the exposure light IL and the shape of the aperture stop in the illumination optical system ILS. Then, as the simplest control, the imaging characteristic calculation section sets the irradiation amount of the correcting lights LBC and LBD in the areas 63C and 63D, which constitute together with the areas 34A a rotationally symmetric areas as a whole, to be almost equal to the heat energy by the exposure light IL, and this information is supplied to the correcting light control section in the main control system 24. In the correcting light irradiation section, the irradiation amount of the correcting lights LBC and LBD is calculated using, for example, the information on the absorption rate by the lens 32 of the correcting lights LBA to LBD, and this information on the irradiation amount and irradiation timing is supplied to the corresponding laser power supply in the correcting light irradiation mechanism 40. The laser power supply causes the corresponding $CO_2$ lasers to carry out light emitting at a predetermined power, and sets the irradiation time to a value of (irradiation amount)/(average power). This average power is an average power during the irradiation time and is controlled so that the average power is stabilized, as one example. This control may also be referred to as the "average power control". Accordingly, the irradiation amount of the correcting lights LBC and LBD is controlled adequately.

Moreover, as for the irradiation timing, (1) the same timing as the illumination of the exposure light IL, (2) at the time of stepwisely moving the wafer stage 20, or (3) from at the time when it is determined that the asymmetrical aberration exceeds a predetermined tolerance, or the like can be considered, for example.

By the way, if the lens to be irradiated with the correcting light is a lens in the vicinity of the pupil plane of the projection optical system 14, which is conjugate with the pupil plane of the illumination optical system ILS, like the lens 32 of this example, then the effect of correcting the center astigmatism increases. At this time, the correcting light may irradiate a plurality of lenses in the vicinity of the pupil plane. Furthermore, it is more advantageous, if the illumination areas of the exposure light and the irradiation areas of the correcting light combined on the optical member are located as close to rotationally symmetric as possible. However, even if an optical member (lens or the like) of any position in the projection optical system 14 is irradiated with the correcting light, the effect of correcting the center astigmatism can be obtained in an almost desired range by controlling the irradiation amount. Moreover, by irradiation with the correcting light together with illumination with the exposure light like in this embodiment, rotationally asymmetric aberration other than the center astigmatism will also decrease.

Moreover, in addition to the case where the rotationally asymmetric aberration caused by a rotationally asymmetric illumination like a dipole illumination is corrected, for example, also in the case where a high order rotationally symmetric aberration, such as a high order spherical aberration, arises in carrying out exposure under a illumination condition in which the light quantity distribution significantly varies locally in the radial direction on the pupil plane of the projection optical system 14, a high order rotationally symmetric aberration can be reduced by irradiation with the correcting light like in this example. As one example, when carrying out a small ca illumination, in FIG. 7 four areas 63A to 63D spaced apart in the radial direction from the optical axis AX on the lens 32 may be irradiates with the correcting lights LBA to LBD. Because this reduces the variation amount of the light quantity distribution in the radial direction in the vicinity of the pupil plane of the projection optical system 14, occurrence of a high order spherical aberration or the like is suppressed, thereby keeping an excellent imaging characteristic.

Moreover, for example, in the case where only an end area in the —X direction on the reticle 11 of FIG. 1 is illuminated with the exposure light IL which occurs according to a pattern to be transferred or according to the setting of the field stop, for example, this illumination becomes rotationally asymmetric significantly. In order to deal with such a case, the optical member on the reticle 11 side of the projection optical system 14, or the reticle 11 itself may be regarded as a predetermined member to be irradiated with the correcting light, and the correcting light may irradiate the end portion in the +X direction of the predetermined member. That is, a target to be irradiated with the correcting light (light beam) can be not only one or plural arbitrary optical members in the projection optical system 14 but also the reticle 11 itself.

Furthermore, in FIG. 6, for example, temperature sensors, such as a thermistor, may be prepared at an equiangular interval (e.g., four places, eight places or the like) in the periphery of the lens 32, and based on the measured values of these temperature sensors the irradiation amount of the correcting lights LBA to LBD may be controlled.

Moreover, the optical member which the correcting light irradiates, and the number, position, shape, and size of the irradiation area of the correcting light on the optical member, can be determined according to a type of aberration to be adjusted by irradiation with the correcting light, or a tolerance of the aberration.

[Modification Example of the First Embodiment]

Figure 9:
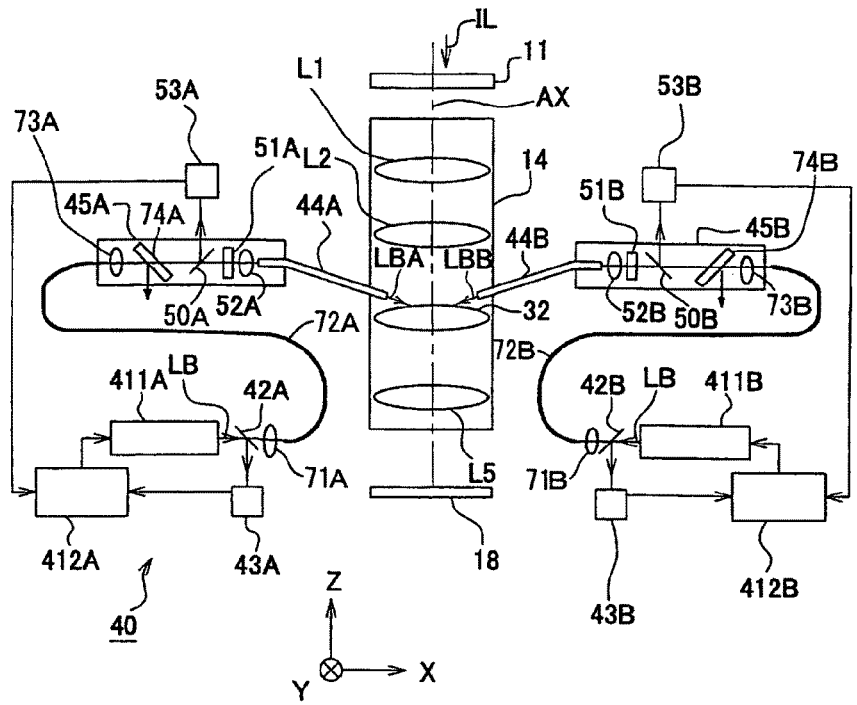
FIG. 9 is a view showing a modification example of the correcting light irradiation mechanism 40 of the first embodiment.

Next, a modification example of the first embodiment is described with reference to FIG. 9. FIG. 9 shows a modification example of the correcting light irradiation mechanism 40 of the first embodiment of FIG. 6. In FIG. 9 where the same numerals are given to the same portions corresponding to FIG. 6, a part of the correcting light LB with a linear polarization emitted from the RF excited waveguide type $CO_2$ laser is split by the beam splitter 42A and received by the photodetector 43A, and the detected signal is fed back to the laser power supply 412A. The correcting light LB which transmitted the beam splitter 42A enters one end of a hollow fiber 72A as an optical guide through the condenser lens 71A, and the correcting light LB which propagated in the hollow fiber 72A enters the irradiation unit 45A. The hollow fiber 72A is composed of a narrow tube made of ceramics or metal, and the inner wall thereof is coated with a material having a high reflectivity at the wavelength of the correcting light LB. In order to increase the efficiency of light propagation, it is preferable that a dielectric film be formed in the inner wall of the narrow tube of the hollow fiber 72A as required. Furthermore, because in this example the laser beam SL of visible light at a wavelength of 670 nm emitted from the semiconductor laser light source 61 of FIG. 1 also irradiates the lens 32 together with the correcting light LB, the reflective film in the hollow fiber 72A is formed so that the reflectivity is high at two wavelengths of the correcting light LB and the laser beam SL (guide light). In addition, as the optical guide, a regular optical fiber or the like may be used in place of the hollow fiber 72A.

A collimator lens 73A and a polarization plate 74A as the polarization state control mechanism are set in a pre-stage section of the irradiation unit 45A of this modification example. As the polarization plate 74A, a plate in which the incident angle with respect to an incident light beam is Brewster's angle is used, and the polarization state of the light beam which transmitted the polarization plate 74A is a linear polarization light consisting of approximately p polarization component. However, as the polarization plate 74A, additionally a polarization prism (Glan-Thomson prism or the like) or a polarization filter which allows only a linear polarization light polarized in a predetermined direction to pass through can be also used.

The correcting light LB which entered the irradiation unit 45A from the hollow fiber 72A is converted into an almost parallel light beam by the collimator lens 73A, and thereafter, it passes through the polarization plate 74A to be a light with almost linear polarization, and it enters a beam splitter 50A (second beam splitter). The light directing optical system is comprised of the condenser lens 71A, hollow fiber 72A, and polarization plate 73A. In the light directing optical system of this example, the polarization state of the correcting light LB propagating in the hollow fiber 72A may vary gradually. Accordingly, in order to make the polarization state of the correcting light LB, which passed through the hollow fiber 72A, to be linearly polarized, the polarization plate 74A is prepared. In addition, from the polarization plate 74A, polarization components other than the polarization component passing through the irradiation unit 45A are emitted to the outside. The light to be emitted to the outside this way is preferably guided to a place, where no problem arises with regards to exposure, by the use of a waveguide (not shown) with a structure similar to that of the waveguide 44A, for example.

In the irradiation unit 45A of FIG. 9, the correcting light reflected and split by the beam splitter 50A is received by the photodetector 53A (photoelectric sensor), and this detected signal is fed back to the laser power supply 412A. The correcting light LB with a linear polarization which transmitted the beam splitter 50A passes the ¼ wavelength plate 51A corresponding to the phase plate as the polarization state control mechanism and is converted into a circular polarization, and thereafter, it is condensed to an incident port of the hollow waveguide 44A by the condenser lens 52A. Then, the correcting light LB which propagated in the waveguide 44A by internal reflections is obliquely and directly incident upon the surface of the lens 32 in the projection optical system 14 as the correcting light LBA. Because in this case the correcting light LB which enters the waveguide 44A through the ¼ wavelength plate 51A is a circular polarization light, the correcting light LBA irradiating the lens 32 from the waveguide 44A is also a nearly stable circular polarization light. Then, the correcting light LBA whose polarization characteristic is stable, the correcting light LBA having been emitted from the waveguide 44A, is stably absorbed by the lens 32, thereby heating the lens 32 locally.

In FIG. 9, in this example, an optical system for irradiating other area of the lens 32 with a correcting light LBB from a waveguide 44B is disposed, which is controllable in parallel with and also independently from the optical system (from the $CO_2$ laser 411A to the condenser lens 52A) for irradiating the lens 32 with the correcting light LBA from the waveguide 44A. That is, the latter optical system includes a $CO_2$ laser 411B, a beam splitter 42B, a condenser lens 71B, a hollow fiber 72B, an irradiation unit 45B (a collimator lens 73B, a polarization plate 74B, a beam splitter 50B, a ¼ wavelength plate 51B, and a condenser lens 52B), a photodetector 53B, and a waveguide 44B. Then, the correcting light LB with a linear polarization emitted from the $CO_2$ laser 411B irradiates the lens 32 through the waveguide 44B as the correcting light LBB with a stable circular polarization.

Also in this modification example, like in FIG. 7 an optical system for irradiating two areas in the Y direction of the lens 32 with the correcting light is also provided, and the configuration of the optical system is almost the same as that of FIG. 9. The configuration other than this is the same as that of the embodiment of FIG. 6. Also in this modification example, by irradiating the lens 32 with the correcting lights LBA and LBB or the like, the occurrence of the center astigmatism can be suppressed, thereby improving the imaging characteristic of the projection optical system 14. Because in this case the hollow fibers 72A and 72B are used in the light directing optical system, the configuration of the light directing optical system can be simplified and high in freedom for the placement.

SECOND EMBODIMENT

Next, a second embodiment of the present invention is described with reference to FIG. 10. In this example, the light sources for the correcting lights are made common, and in FIG. 10 the same numerals are given to the portions corresponding to those of FIG. 1 and FIG. 6 and the detailed descriptions thereof are omitted.

Figure 10:
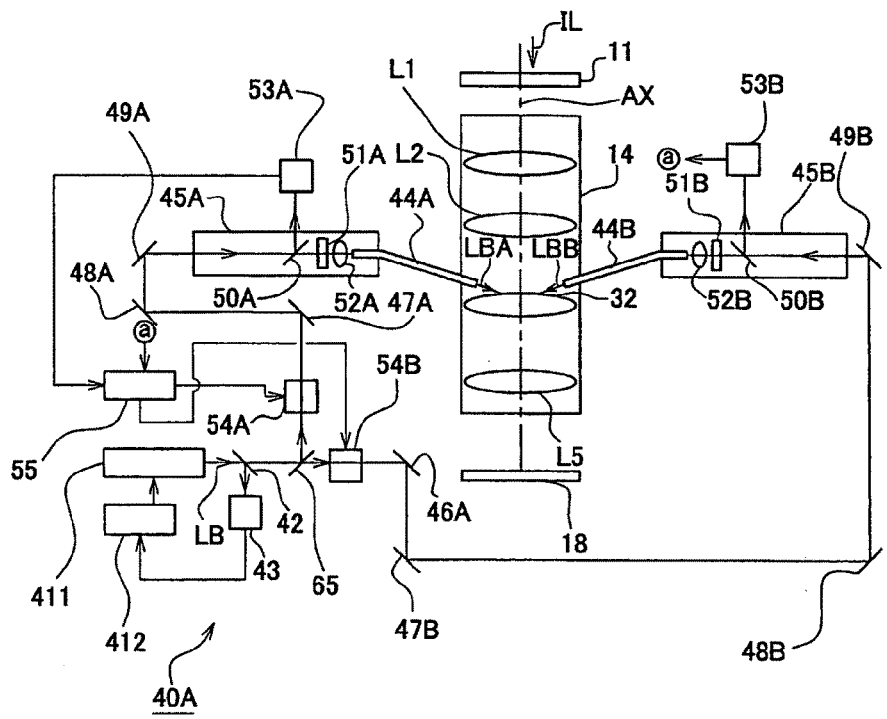
FIG. 10 is a view showing a configuration of a correcting light irradiation mechanism 40A of a second embodiment of the present invention.

FIG. 10 shows a correcting light irradiation mechanism 40A as the irradiation mechanism of the light beam of the projection exposure apparatus of this example. In FIG. 10, a $CO_2$ laser 411 and a laser light source 412 are the same as the $CO_2$ laser 411A and the laser light source 412A of FIG. 6, respectively. Then, a part of the correcting light LB consisting of the laser beam with a linear polarization emitted from the $CO_2$ laser 411 are split by the beam splitter 42, and the light quantity of the split light is fed back to the laser light source 412 through the photodetector 43. Moreover, the correcting light LB which transmitted the beam splitter 42 further enters a half mirror 65 (a first beam splitter) to be split into two. The correcting lights LBA and LBB split into two by the half mirror 65 enter variable attenuators 54A and 54B, respectively. Then, the correcting light LBA which passed through the former variable attenuator 54A passes through mirrors 47A, 48A, and 49A (i.e., an optical system for guiding light), and thereafter, irradiates the lens 32 in the projection optical system 14 through the irradiation unit 45A and the waveguide 44A. Moreover, the correcting light LBB which passed through the latter variable attenuator 54B passes through mirrors 47B, 48B, and 49B (i.e., the light directing optical system), and thereafter, it irradiates the lens 32 through the irradiation unit 45B and the waveguide 44B.

Here, the variable attenuators 54A and 54B refer to a device which can control the attenuation factor of the incident light variably by an external signal.

Figure 14:
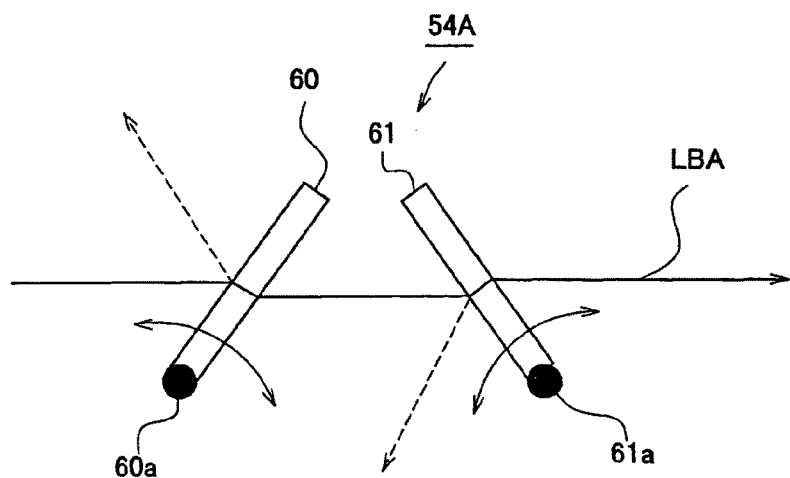
FIG. 14 is a view showing an example of the configuration of a variable attenuator 54A in FIG. 10.

FIG. 14 shows an example of the configuration of the variable attenuator 54A, and in FIG. 14 the correcting light LBA enters two obliquely-tilted light transparent plates 60 and 61. As the quality of the material of the plates 60 and 61, a material with a small absorption at the wavelength of the $CO_2$ laser beam, which is the correcting light LBA, for example, zinc selenide (ZnSe) or the like can be used. Moreover, to the surfaces of the plates 60 and 61, a highly reflective film or the like can be coated as required. If two plates 60 and 61 are tilted so that the incident angle with respect to the incident beam becomes symmetrical, then the reflected light amount varies according to the inclining angle, and therefore, the light quantity of the correcting light LBA transmitting the plates 60 and 61 can be controlled continuously. In order to set the inclining angle of the plates 60 and 61 to an arbitrary value, rotation drivers 60a and 61a are prepared, respectively. As the rotation drivers 60a and 61a, a general stepping motor or an ultrasonic motor can be used. The other variable attenuator 54B may be configured in the same way.

Back to FIG. 10, the transmittance of the correcting light in the variable attenuators 54A and 54B is controlled by a control unit 55 of the variable attenuators. In this case, the light quantities of the correcting lights LBA and LBB, which were split in the irradiation unit 45A and 45B and detected by the photodetectors 53A and 53B, are inputted to the control unit 55. The configuration other than this is the same as that of the first embodiment.

In this example, the irradiation amount of the correcting lights LBA and LBB which irradiate the lens 32 from the waveguides 44A and 44B are controlled, roughly as follows. First, indicated values for the respective target irradiation amounts of the correcting lights LBA and LBB from the correcting light control section in the main control system 24 of FIG. 1 are provided to the control unit 55 of the laser power supply 412 and variable attenuators 54A and 54B. From these values, the laser power supply 412 controls the power of the correcting light LB to the beam splitter 42 by the $CO_2$ laser 411 to be a predetermined value. Next, based on the light quantity detected by the photodetectors 53A and 53B, the control unit 55 controls the attenuation factor in the variable attenuators 54A and 54B so that the power of the correcting lights LBA and LBB becomes the predetermined value. Then, when the irradiation time of the correcting lights LBA and LBB becomes a value of the (irradiation amount)/(average power), in the control unit 55 the attenuation factor of the variable attenuators 54A and 54B is set to approximately 100%, for example, thereby setting the power of the correcting lights LBA and LBB to approximately 0. Alternatively, for example, an instruction to stop light emitting is issued from the control unit 55 to the laser power supply 412, thereby stopping the light emitting of the $CO_2$ laser 411. Also in this case, for example, an average power control is carried out. Also in this example, with these operations, the irradiation amount of the correcting lights LBA and LBB can be controlled to be the desired value.

According to this example, the laser light source of the correcting lights LBA and LBB which irradiate a plurality of places on the lens 32 is made common, and therefore, the production cost can be reduced and the correcting light irradiation mechanism 40A can be miniaturized as compared with the correcting light irradiation mechanism 40 of FIG. 6. Note that, although in this example there is only one control unit 55, a plurality of control units may be prepared correspondingly to the variable attenuators 54A and 54B, respectively. Moreover, also in this example, there may be a plurality of light source devices consisting of a series of the $CO_2$ laser 411, the beam splitters 42, the photodetectors 43, and the laser power supply 412 corresponding to the number of the correcting lights LBA and LBB which irradiate the lens 32, and these may be controlled mutually independent according to the indicated values of the mutually independent outputs from the correcting light control section.

[Modification Example of the Second Embodiment]

Figure 11:
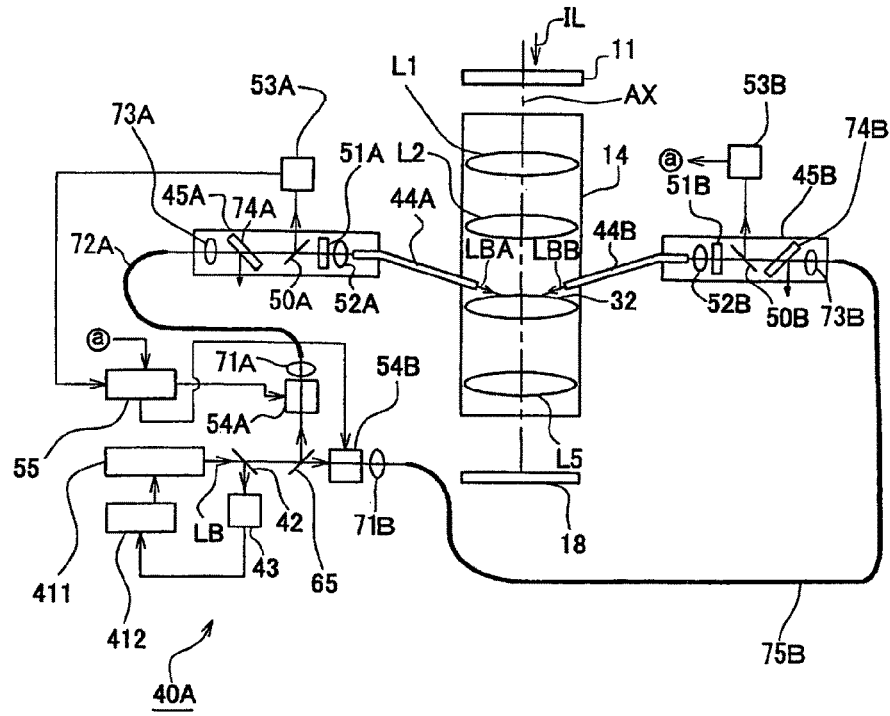
FIG. 11 is a view showing a modification example of the correcting light irradiation mechanism 40A of the second embodiment.

Next, a modification example of the second embodiment is described with reference to FIG. 11. FIG. 11 shows a modification example of the correcting light irradiation mechanism 40A of the second embodiment of FIG. 10. In FIG. 11 where the same numerals are given to the same portions corresponding to FIG. 9 and FIG. 10, the irradiation units 45A and 45B include the collimator lenses 73A and 73B, and the polarization plates 74A and 74B (i.e. a polarization state control mechanism) in a pre-stage section, respectively, like the irradiation units 45A and 45B of FIG. 9. Then, the correcting light LB consisting of the laser beam with a linear polarization which was emitted from the $CO_2$ laser 411 and which transmitted the beam splitter 42 further enter the half mirror 65 (the first beam splitter) to be split into two. The correcting lights LBA and LBB split into two by the half mirror 65 enter the variable attenuators 54A and 54B, respectively. Then, the correcting light LBA which passed through the former variable attenuator 54A passes through a condenser lens 71A and a hollow fiber 72A (optical guide), and thereafter, it irradiates the lens 32 in the projection optical system 14 through the irradiation unit 45A and the waveguide 44A. Moreover, the correcting light LBB which passed through the latter variable attenuator 54B passes through a condenser lens 71B and a hollow fiber 75B, which has the same configuration as the hollow fiber 72A but is longer than the hollow fiber 72A, the hollow fiber 75B being as an optical guide, and thereafter, it irradiates the lens 32 through the irradiation unit 45B and the waveguide 44B. In this case, the respective light directing optical system are comprised of the condenser lenses 71A and 71B, hollow fibers 72A and 75B, and collimator lenses 73A and 73B. The configuration other than this and the irradiation operation of the correcting lights LBA and LBB are the same as those of the second embodiment.

Also in this modification example, the laser light sources of the correcting lights LBA and LBB which irradiate a plurality of places on the lens 32 are made common, and therefore, the production cost can be reduced and the correcting light irradiation mechanism 40A can be miniaturized as compared with the correcting light irradiation mechanism 40 of FIG. 6. Moreover, because in this case the hollow fibers 72A and 75B are used in the light directing optical system, the configuration of the light directing optical system can be simplified and high in freedom for the placement.

THIRD EMBODIMENT

Next, a third embodiment of the present invention is described with reference to FIG. 12. In this example, the light sources for the correcting lights are made common, and the switching thereof is carried out using a variable mirror method, and in FIG. 12 the same numerals are given to the same portions corresponding to those of FIG. 10 and the detailed descriptions thereof are omitted.

Figure 12:
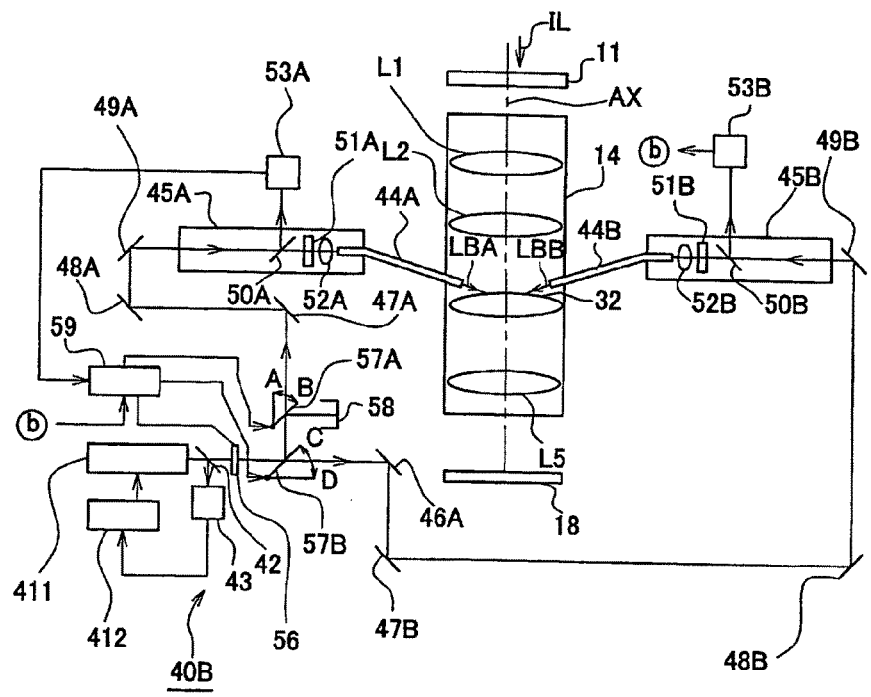
FIG. 12 is a view showing a configuration of a correcting light irradiation mechanism 40B of a third embodiment of the present invention.

FIG. 12 shows the correcting light irradiation mechanism 40B as the irradiation mechanism of the light beam of the projection exposure apparatus of this embodiment. In FIG. 12, a part of the correcting light LB consisting of a laser beam with a linear polarization emitted from the $CO_2$ laser 411 are split by the beam splitter 42, and the light quantity of the split light is fed back to the laser light source 412 through the photodetector 43. In response to an instruction about the irradiation timing of the correcting light from the correcting light control section in the main control system 24 of FIG. 1, the laser light source 412 causes the $CO_2$ laser 411 to carry out light emitting continuously and controls the output of the correcting light LB to the beam splitter 42.

In the emerging plane of the beam splitter 42, an electric shutter 56 is disposed so as to freely open and close, and when the shutter 56 is open, the correcting light LB which transmitted the beam splitter 42 enters a first variable mirror 57B. In the first variable mirror 57B, one end thereof is fixed, and if a movable part is closed to a position C, the correcting light LB is reflected by approximately 90° and goes toward a second variable mirror 57A, while if the movable part is opened to a position D, the correcting light LB goes straight as is and enters the mirror 46A. Moreover, also in the second variable mirror 57A, one end thereof is fixed, and if a movable part is opened to a position A, the correcting light LB from the variable mirror 57B goes straight as is toward the mirror 47A, while if the movable part is closed to a position B, the correcting light LB from the variable mirror 57B is reflected by approximately 90° and is stopped by a beam stopper 58. That is, the correcting light LB can be split into three optical paths depending on the conditions of the switching of the two variable mirrors 57A and 57B. The switching operation of two variable mirrors 57A, 57B and the opening and closing operation of the shutter 56 are controlled by a control unit 59 of the variable mirrors.

Then, while the movable part of the variable mirror 57B is closed to the position C and the movable part of the variable mirror 57A is opened to the position A, the correcting light LB is reflected by the variable mirror 57B and it passes through the mirrors 47A, 48A, and 49A (i.e., the light directing optical system), and thereafter, it irradiates the lens 32 through the irradiation unit 45A and the waveguide 44A in the projection optical system 14 as the correcting light LBA. Moreover, while the movable part of the variable mirror 57B is opened to the position D, the correcting light LB passed through the vicinity of the variable mirror 57B, and thereafter, it passes through the mirrors 47B, 48B, and 49B (i.e. the light directing optical system), and thereafter it irradiates the lens 32 through the irradiation unit 45B and the waveguide 44B as the correcting light LBB. In this example, the light quantities of the correcting lights, which are split in the irradiation units 45A and 45B, and are detected by the photodetectors 53A and 53B, are inputted to the control unit 59, respectively. The configuration other than this is the same as those of the first and second embodiments.

In this embodiment, the irradiation amount (dose) of the correcting lights LBA and LBB irradiating the lens 32 from the waveguides 44A and 44B, or in other words, a (power)× (irradiation time) is controlled at a certain time duration, as follows. That is, in this example, the detected signals of the photodetectors 53A and 53B are integrated during a certain time duration, and the integrated values (values proportional to the irradiation amount of the correcting lights LBA and LBB) are used as the control signal. By the way, controlling the irradiation amount by a certain time duration agrees with the average power control in the first and second embodiments, in the extreme condition.

In this case, in FIG. 12, at first, from the correcting light control section in the main control system 24 of FIG. 1 to the control unit 59 of the variable mirrors, a desired value of the irradiation amount of the correcting lights LBA and LBB is indicated. Because at this moment an instruction about the light emitting timing of the correcting light is issued to the laser power supply 412, the $CO_2$ laser 411 starts emitting light. Thereafter, the control unit 59 operates the variable mirrors 57A and 57B to move the movable part of the variable mirror 57A to the position A, and move the movable part of the variable mirror 57B to the position C. If the shutter 56 is open at this point, the correcting light LBA irradiates the lens 32 and the output of the photodetector 53A is integrated in the control unit 59. At the time when the integrated value met with the indicated value provided in advance, the control unit 59 moves the movable part of the variable mirror 57B to the position B. Accordingly, both irradiations of the correcting lights LBA and LBB are stopped.

Next, in order to set the irradiation amount of the correcting light LBB to a desired value, the control unit 59 moves the movable part of the variable mirror 57B to the position D. If the shutter 56 is open at this point, the correcting light LBB irradiates the lens 32 and the output of the photodetector 53B is integrated in the control unit 59. At the time when the integrated value met with the indicated value provided in advance, the control unit 59 moves the movable part of the variable mirror 57B to the position C, the movable part of the variable mirror 57A to the position B, and stops the irradiation of the correcting lights LBA and LBB. By repeating this operation during a definite time interval, the irradiation amount of the correcting lights LBA and LBB is controlled to be an appropriate value sequentially.

Also in this embodiment, because the $CO_2$ laser 411 is used in common with respect to a plurality of irradiation areas of the correcting lights LBA and LBB, the correcting light irradiation mechanism 40B can be miniaturized. Moreover, by controlling the irradiation amount using the opening and closing time of the variable mirrors 57A and 57B, utilization efficiency of the laser beam as the correcting light can be increased as compared with the case where a variable attenuator is used.

In addition, as the variable mirrors 57A and 57B, any mirror can be used as long as the mirror can move according to instructions from the control unit 59 of the variable mirror. Specifically, as the variable mirrors 57A and 57B, for example, a voltage driven mirror (galvanometer mirror) or a pneumatically driven mirror can be used.

[Modification Example of the Third Embodiment]

Figure 13:
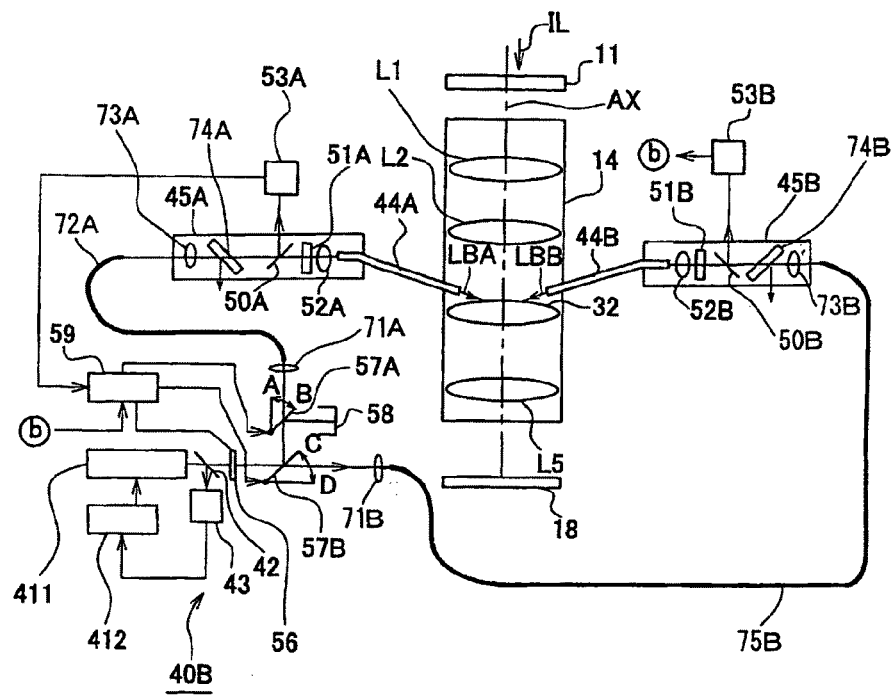
FIG. 13 is a view showing a modification example of the correcting light irradiation mechanism 40B of the third embodiment.

Next, a modification example of the third embodiment is described with reference to FIG. 13. FIG. 13 shows a modification example of the correcting light irradiation mechanism 40B of the third embodiment of FIG. 12. In FIG. 13 where the same numerals are given to the same portions corresponding to FIG. 11 and FIG. 12, the irradiation units 45A and 45B include the collimator lenses 73A and 73B, and the polarization plates 74A and 74B (i.e. the polarization state control mechanism) in the pre-stage section, respectively, like the irradiation units 45A and 45B of FIG. 11. Then, the correcting light LB consisting of a laser beam with a linear polarization, which was emitted from the $CO_2$ laser 411 and which transmitted the beam splitter 42, goes toward the first variable mirror 57B.

Then, while the movable part of the variable mirror 57B is closed to the position C and the movable part of the variable mirror 57A is opened to the position A, the correcting light LB is reflected by the variable mirror 57B, and it passes through the condenser lens 71A and the hollow fiber 72A, and thereafter, it irradiates the lens 32 in the projection optical system 14 through the irradiation unit 45A and the waveguide 44A as the correcting light LBA. Moreover, while the movable part of the variable mirror 57B is opened to the position D, the correcting light LB, after having passed the vicinity of the variable mirror 57B, passes through the condenser lens 71B and the hollow fiber 75B, and thereafter it irradiates the lens 32 through the irradiation unit 45B and the waveguide 44B as the correcting light LBB. The light directing optical system is comprised of the condenser lenses 71A and 71B, the hollow fibers 72A and 75B, and the collimator lenses 73A and 73B, respectively. The configuration and the irradiation operation of the correcting light other than these are the same as those of the third embodiment.

Because also in this modification example the $CO_2$ laser 411 is used in common with respect to a plurality of irradiation areas of the correcting lights LBA and LBB, the correcting light irradiation mechanism 40B can be miniaturized. Moreover, by controlling the irradiation amount using the opening and closing time of the variable mirrors 57A and 57B, utilization efficiency of the laser beam as the correcting light can be increased as compared with the case where a variable attenuator is used. Moreover, because the hollow fibers 72A and 75B are used in the light directing optical system, the configuration of the light directing optical system is simplified and the freedom for the placement is increased.

Note that the present invention can be applied not only to scanning exposure type exposure apparatuses but also to the cases where exposure is carried out using a full field exposure type exposure apparatus. Moreover, the present invention can be also applied to the immersion type exposure apparatus disclosed in, for example, International Publication No. WO 99/049504 A1, and the like.

Moreover, although in the above description the correcting light is directed locally to the lens plane (i.e., an area which the exposure light can enter (or emerge from)), of the optical member of a part of a projection optical system, the correcting light may be directed to a side face of the optical member of the part of the projection optical system. The configuration, wherein a correcting light is directed to a side face of an optical member, is disclosed in Japanese Patent Application Laid-open No. 2001-196305, and its corresponding U.S. Pat. No. 6,504,597, and as long as the national law of designated countries designated (or selected countries) selected in this International Application allows, the disclosure of the above Publications are incorporated herein by reference as a part of the present specification.

Moreover, the projection exposure apparatuses of the embodiments described above can be produced by incorporating the illumination optical system comprised of a plurality of lenses and the projection optical system into an exposure apparatus body, carrying out optical adjustments, and attaching the reticle stage and wafer stage comprised of a number of mechanical parts to the exposure apparatus body for wiring and piping, and further carrying out overall adjustments (electric adjustments, operation checks, or the like). In addition, it is preferable that the production of these exposure apparatuses be carried out in a clean room where temperature, cleanliness, and the like are controlled.

Moreover, in producing semiconductor devices using the projection exposure apparatuses of the embodiments described above, this semiconductor device is produced through the steps of: carrying out a function and performance design of the device; producing a reticle based on this step; forming wafers from a silicon material; carrying out alignment by using the projection exposure apparatus of the embodiments described above and exposing a pattern of a reticle onto a wafer; forming a circuit pattern, such as etching; assembling devices (including the steps of dicing, bonding, and packaging); and testing and the like.

Moreover, the use of the exposure apparatus of the present invention is not limited to the exposure apparatus used for the semiconductor device production, but can be also applied broadly, for example, to exposure apparatuses used for liquid crystal display elements formed in a square glass plate, or display devices, such as plasma display units, and to exposure apparatuses for producing various devices, such as imaging devices (CCD or the like), micro machine, thin film magnetic heads, and DNA chips. Furthermore, the present invention can be applied also to the exposure process (exposure apparatus) when producing masks (photomask, reticle, or the like), in which mask patterns for various devices are formed, by using a lithography process.

In addition, needless to say, the present invention is not limited to the embodiments described above, and various configurations can be employed without departing from the scope and spirit of the present invention. Moreover, the entire contents including the specification, claims, drawings, and abstract, which are disclosed in Japanese Patent Application No. 2004-037183 filed on Feb. 13, 2004, are hereby incorporated by reference.

According to the device production method of the present invention, the imaging characteristic can be kept in an excellent state all the time even if, for example, a dipole illumination, a small σ illumination, or the like are used, and therefore, devices in high integration can be produced with high precision.

The invention claimed is:

1. An exposure method, comprising:
    illuminating a first object with an exposure beam; and
    exposing a second object with the exposure beam through the first object and a projection optical system, wherein
    a light beam having a wavelength range different from a wavelength range of the exposure beam enters one end of an optical guide,
    by a polarization state control mechanism, a polarization state of the light beam which has passed through the optical guide is changed into a linearly-polarized state, and then changed into a predetermined polarized state, and
    a part of at least one of the first object and the projection optical system is irradiated with the light beam in the predetermined polarized state to correct an imaging characteristic of the projection optical system.

2. An exposure method as recited in claim 1, wherein the optical guide is a hollow fiber.

3. An exposure method as recited in claim 1, wherein
    the polarization state control mechanism includes a polarization plate, and
    the polarization state of the light beam which has passed through the optical guide is changed into the linearly-polarized state by the polarization plate.

4. An exposure method as recited in claim 1, wherein
    the polarization state control mechanism includes a polarization prism or a polarization filter which allows only linearly-polarized light polarized in a predetermined direction to pass through, and
    the polarization state of the light beam which has passed through the optical guide is changed into the linearly-polarized state by the polarization prism or the polarization filter.

5. An exposure method as recited in claim 1, wherein
    the polarization state control mechanism includes a phase plate, and
    the light beam in the linearly-polarized state is changed into the predetermined polarized state by the phase plate.

6. An exposure method as recited in claim 5, wherein
    the phase plate is a ¼ wavelength plate, and
    the predetermined polarized state is a circularly-polarized state.

7. An exposure method as recited in claim 1, wherein
    the light beam whose polarization state has been changed into the linearly-polarized state by the polarization state control mechanism is split into a plurality of light beams,
    a part of the plurality of light beams is detected by a photoelectric sensor, and
    an irradiation amount of the light beam with which the part of at least one of the first object and the projection optical system is to be irradiated, is controlled based on a signal detected by the photoelectric sensor.

8. An exposure method as recited in claim 1, wherein the light beam is generated by an RF excited waveguide type $CO_2$ laser.

9. An exposure method as recited in claim 1, wherein
    the part of at least one of the first object and the projection optical system is illuminated in a rotationally asymmetric light-quantity distribution with the exposure beam, and
    the light beam is irradiated so as to correct a rotationally asymmetric aberration of the projection optical system generated by the illumination with the exposure beam.

10. An exposure method as recited in claim 9, wherein
    a generated amount of the rotationally asymmetric aberration is calculated based on an irradiation amount of the exposure beam for the illumination, and the light beam is irradiated based on the calculated result.

11. A device production method comprising:
    transferring a pattern onto a photosensitive element by operating
    using the exposure method as recited in claim 1.

12. An exposure apparatus which illuminates a first object on which a pattern for transfer is formed with an exposure beam and exposes a second object with the exposure beam through the first object and a projection optical system, comprising:
    an irradiation mechanism which irradiates a part of at least one of the first object and the projection optical system with a light beam having a wavelength range different from a wavelength range of the exposure beam, wherein
    the irradiation mechanism includes:
        an optical guide into which the light beam enters;
        a polarization state control mechanism which changes a polarization state of the light beam which has passed through the optical guide into a linearly-polarized state, and then into a predetermined polarized state, and
        a space waveguide mechanism which guides the optical beam in the predetermined polarized state into the part of at least one of the first object and the projection optical system.

13. An exposure apparatus as recited in claim 12, wherein the optical guide is a hollow fiber.

14. An exposure apparatus as recited in claim 12, wherein
    the polarization state control mechanism includes a polarization plate, and
    the polarization state of the light beam which has passed through the optical guide is changed into the linearly-polarized state by the polarization plate.

15. An exposure apparatus as recited in claim 12, wherein
    the polarization state control mechanism includes a polarization prism or a polarization filter which allows only linearly-polarized light polarized in a predetermined direction to pass through, and
    the polarization state of the light beam which has passed through the optical guide is changed into the linearly-polarized state by the polarization prism or the polarization filter.

16. An exposure apparatus as recited in claim 12, wherein
    the polarization state control mechanism includes a phase plate, and
    the light beam in the linearly-polarized state is changed into the predetermined polarized state by the phase plate.

17. An exposure apparatus as recited in claim 16, wherein
    the phase plate is a ¼ wavelength plate, and
    the predetermined polarized state is a circularly-polarized state.

18. An exposure apparatus as recited in claim 12, wherein the irradiation mechanism includes:
- a beam splitter which splits the light beam whose polarization state has been changed into the linearly-polarized state by the polarization state control mechanism into a plurality of light beams;
- a photoelectric sensor which detects a part of the plurality of light beams split by the beam splitter; and
- a control unit which controls an irradiation amount of the light beam with which the part of at least one of the first object and the projection optical system is to be irradiated, based on a signal detected by the photoelectric sensor.

19. An exposure apparatus as recited in claim 12, wherein the irradiation mechanism includes an RF excited waveguide type $CO_2$ laser as a light source which generates the light beam.

20. An exposure apparatus as recited in claim 19, wherein there are a plurality of the RF excited waveguide type $CO_2$ lasers.

21. A exposure apparatus as recited in claim 12, wherein the irradiation mechanism includes:
- a first beam splitter which splits the light beam; and
- a variable attenuator which continuously controls a transmitted light amount of the light beam split by the first beam splitter and enters the light beam into the optical guide.

22. An exposure apparatus as recited in claim 12, wherein the irradiation mechanism includes at least one of a movable mirror and a shutter in order to time-divide the light beam.

23. An exposure apparatus as recited in claim 12 further comprising a light source control unit which controls a light emitting duration of a light source which generates the light beam.

24. An exposure apparatus as recited in claim 12, wherein the space waveguide mechanism includes a hollow waveguide made of glass, ceramics, or metal.

25. An exposure apparatus as recited in claim 24, wherein an inner surface of the hollow waveguide is coated with a reflective film including at least one of a metal film and a dielectric film.

26. An exposure apparatus as recited in claim 12, wherein
- the part of at least one of the first object and the projection optical system is illuminated in a rotationally asymmetric light-quantity distribution with the exposure beam, and
- the irradiation mechanism irradiates the light beam so as to correct a rotationally asymmetric aberration of the projection optical system generated by the illumination with the exposure beam.

27. An exposure apparatus as recited in claim 26 further comprising:
- an aberration correction mechanism which corrects the rotationally symmetric aberration of the projection optical system; and
- a control unit which controls operations of the irradiation mechanism and the aberration correction mechanism to correct an aberration of the projection optical system.

28. A device production method comprising:
transferring a pattern onto a photosensitive element by operating
the exposure apparatus as recited in claim 12.

* * * * *

UNITED STATES PATENT AND TRADEMARK OFFICE
CERTIFICATE OF CORRECTION

PATENT NO. : 8,111,378 B2
APPLICATION NO. : 10/588730
DATED : February 7, 2012
INVENTOR(S) : Kiyoshi Uchikawa It is certified that error appears in the above-identified patent and that said Letters Patent is hereby corrected as shown below:

At column 30, line 17, please delete the word "using."

Signed and Sealed this
Eighth Day of May, 2012

David J. Kappos
*Director of the United States Patent and Trademark Office*